US012770549B2

(12) United States Patent
Cok

(10) Patent No.: US 12,770,549 B2
(45) Date of Patent: Oct. 20, 2026

(54) ELECTRO-OPTICAL DISPLAYS WITH ROW AND COLUMN LIGHT-PIPES

(71) Applicant: Daktronics, Inc., Brookings, SD (US)

(72) Inventor: Ronald S. Cok, Rochester, NY (US)

(73) Assignee: Daktronics, Inc., Brookings, SD (US)

( * ) Notice: Subject to any disclaimer, the term of this patent is extended or adjusted under 35 U.S.C. 154(b) by 0 days.

(21) Appl. No.: 18/740,002

(22) Filed: Jun. 11, 2024

(65) Prior Publication Data

US 2025/0078733 A1 Mar. 6, 2025

Related U.S. Application Data

(60) Provisional application No. 63/579,808, filed on Aug. 30, 2023.

(51) Int. Cl.

| | |
|---|---|
| ***G09G 3/22*** | (2006.01) |
| ***G09G 3/32*** | (2016.01) |
| ***H10H 20/855*** | (2025.01) |
| ***H10W 90/00*** | (2026.01) |

(52) U.S. Cl.

CPC ............. *G09G 3/32* (2013.01); *H10H 20/855* (2025.01); *H10W 90/00* (2026.01); *G09G 2300/0465* (2013.01); *G09G 2360/147* (2013.01); *G09G 2370/18* (2013.01)

(58) Field of Classification Search

CPC ............. G09G 3/32; G09G 2300/0465; G09G 2360/047; G09G 2370/18; H01L 25/167; H10H 20/855

See application file for complete search history.

(56) References Cited

U.S. PATENT DOCUMENTS

| | | | |
|---|---|---|---|
| 7,622,367 | B1 | 11/2009 | Nuzzo et al. |
| 7,943,491 | B2 | 5/2011 | Nuzzo et al. |
| 8,506,867 | B2 | 8/2013 | Menard |
| 8,722,458 | B2 | 5/2014 | Rogers et al. |
| 8,889,485 | B2 | 11/2014 | Bower |
| 10,103,069 | B2 | 10/2018 | Bower et al. |
| 10,153,256 | B2 | 12/2018 | Cok et al. |
| 10,224,460 | B2 | 3/2019 | Bower et al. |

(Continued)

OTHER PUBLICATIONS

Cok, R. S. et al., Inorganic light-emitting diode displays using micro-transfer printing, Journal of the SID, 25(10):589-609, (2017).

*Primary Examiner* — Sanghyuk Park

(74) *Attorney, Agent, or Firm* — Schwegman Lundberg & Woessner, P.A.

(57) ABSTRACT

An electro-optically controlled display includes a display substrate. Row wires, row light-pipes, and column light-pipes are disposed on the display substrate. A row controller provides a respective row electrical signal to each of the row wires and a respective row optical signal to each of the row light-pipes. A column controller provides a respective column optical signal to each of the column light-pipes. Pixels are disposed in rows and columns over the display substrate. Each of the pixels comprises a pixel circuit connected to one of the row wires, to one of the row light-pipes, and to one of the column light-pipes. The pixel circuit receives respective row electrical signals from the row wire, respective row optical signals from the row light-pipe, and respective column optical signals from the column light-pipe.

20 Claims, 20 Drawing Sheets

(56) References Cited

U.S. PATENT DOCUMENTS

| | | | |
|---|---|---|---|
| 10,468,363 | B2 | 11/2019 | Prevatte et al. |
| 11,742,450 | B2 | 8/2023 | Bower et al. |
| 2006/0145970 | A1* | 7/2006 | Krijn .................... G09G 3/3233 345/81 |
| 2010/0253882 | A1* | 10/2010 | Han ........................ G02B 6/005 349/65 |
| 2016/0093600 | A1 | 3/2016 | Bower et al. |
| 2018/0143371 | A1* | 5/2018 | Gollier ................. G02B 6/0068 |
| 2018/0261658 | A1* | 9/2018 | Cok ....................... G01R 31/28 |
| 2019/0333901 | A1* | 10/2019 | Cok .................... H01L 23/5386 |

* cited by examiner

ELECTRO-OPTICAL DISPLAYS WITH ROW AND COLUMN LIGHT-PIPES

PRIORITY APPLICATION

This application claims the benefit of U.S. Provisional Patent Application No. 63/579,808, filed Aug. 30, 2023, which is hereby incorporated by reference herein in its entirety.

TECHNICAL FIELD

The present disclosure relates generally to structures and methods for controlling a display using optical signals or both electrical and optical control signals.

BACKGROUND

Substrates with electronically active components distributed over the extent of the substrate may be used in a variety of electronic systems, for example, in flat-panel display devices such as flat-panel liquid crystal or organic light emitting diode (OLED) displays, in imaging sensors, and in flat-panel solar cells. The electronically active components are typically either assembled on the substrate, for example using individually packaged surface-mount integrated-circuit devices and pick-and-place tools, or by sputtering or spin coating a thin layer of semiconductor material on the substrate and then photolithographically processing the semiconductor material to form thin-film circuits on the substrate. Individually packaged integrated-circuit devices typically have smaller transistors with higher performance than thin-film circuits but the packages are larger than can be desired for highly integrated systems.

Methods for transferring small active components from one substrate to another are described in U.S. Pat. No. 7,943,491. In examples of these approaches, small integrated circuits are formed on a native semiconductor source wafer. The small unpackaged integrated circuits, or chiplets, are released from the native source wafer by etching a layer formed beneath the circuits. A PDMS stamp is pressed against the native source wafer and the process side of the chiplets is adhered to individual stamp posts. The chiplets are removed from the native source wafer and pressed against a destination substrate or backplane with the stamp to adhere the chiplets to the destination substrate. In other examples, U.S. Pat. No. 8,722,458 teaches transferring light-emitting, light-sensing, or light-collecting semiconductor elements from a wafer substrate to a destination substrate or backplane.

Displays typically comprise an array of light-controlling devices arranged over a display substrate in rows and columns. The light-controlling devices can be light emitters (e.g., organic or inorganic light-emitting diodes), light valves (e.g., liquid crystals), or light reflectors, (e.g., electrophoretic ink). In full-color displays, the light-controllers are arranged in groups of pixels that comprise one of each color of light-controller in the display. Displays are usually controlled using matrix addressing in which each row of pixels is activated at a time during which data is sent to each pixel for display by the pixel. Each pixel can be passive, in which case no pixel data is stored in the pixel, or active, in which case pixel data is stored in the pixel. Passive pixels are controlled using passive-matrix control and active pixels are controlled using active-matrix control.

Conventionally, each row of pixels is electrically connected to a row wire and each column of pixels is electrically connected to a column wire, so that each pixel is uniquely connected to each combination of a row wire and a column wire. However, signals provided on row and column wires that extend over large substrates can degrade as they propagate across the large substrate due to the resistance of the wires, propagation delays, and parasitic capacitance that can significantly limit control signal frequencies. Moreover, power and ground signals can have different values at different locations on the display substrate due to resistance in power and ground wires or conductive planes. U.S. Pat. No. 17,008,264 entitled "Hybrid Electro-Optically Controlled Matrix-Addressed System,s" filed Aug. 31, 2020, discloses, among other things, displays with optical column communications and electrical row communications.

There is a need, therefore, for improved display system architectures.

SUMMARY

The present disclosure provides, inter alia, architectures, structures, materials, and methods for improved control of, communication to, and communication from arrays of pixels in a display and, more generally, arrays of functional devices disposed over a substrate. Such architectures, structures, materials, and methods, can be useful in, for example, very high-frame-rate systems.

According to embodiments of the present disclosure, an electro-optically controlled display can comprise a display substrate, row wires extending in a row direction disposed on or in the display substrate, one or more row light-pipes extending at least in the row direction disposed on the display substrate, a row controller operable to provide a respective row electrical signal to each of the row wires and operable to provide a respective row optical signal to each of the row light-pipes, column light-pipes extending in a column direction disposed on the display substrate, a column controller operable to provide a respective column optical signal to each of the column light-pipes, and pixels disposed in rows and columns over the display substrate. Each of the pixels can comprise a pixel circuit that is connected to a unique combination of (i) one of the row wires, (ii) one of the row light-pipes, and (iii) one of the column light-pipes. The pixel circuit can be operable to receive the respective row electrical signal from the one of the row wires, to receive the respective row optical signal from the one of the row light-pipes, and to receive the respective column optical signal from the one of the column light-pipes.

In some embodiments, the row electrical signals comprise row-select signals. In some embodiments, the row optical signals comprise timing signals. In some embodiments, the column optical signals comprise data signals. In some embodiments, the pixels are arranged in a matrix-addressed array over the system substrate.

According to embodiments of the present disclosure, (i) the row wires extend substantially orthogonal to the column light-pipes over the display substrate, (ii) the row light-pipes extend substantially orthogonal to the column light-pipes over the display substrate, or (iii) both (i) and (ii).

According to embodiments of the present disclosure, (i) the column controller comprises an inorganic light-emitting diode that emits light into each of the column light-pipes, (ii) the row controller comprises an inorganic light-emitting diode that emits light into each of the row light-pipes, or (iii) both (i) and (ii).

According to embodiments of the present disclosure, the pixel circuit comprises (i) an optical input circuit responsive to a respective column optical signal and to a respective row optical signal and (ii) an electrical input circuit responsive to a respective row electrical signal, wherein the optical input circuit comprises one or more light sensors.

According to embodiments of the present disclosure, each of the pixels comprises (i) one or more inorganic light-emitting diodes controlled by the pixel circuit, (ii) one or more light sensors to which the pixel circuit is responsive, or (iii) both (i) and (ii). In some embodiments, each of the pixels comprises a pixel substrate non-native to the display substrate. In some embodiments, the pixel substrate comprises a fractured or separated pixel tether.

According to embodiments of the present disclosure, a pixel can comprise a pixel substrate and a pixel circuit operable to respond to a row electrical signal, a row optical signal, and a column optical signal. The pixel circuit can be disposed on, in, or over the pixel substrate. The pixel circuit can comprise a light sensor (e.g., a photosensor or photodiode) and the pixel can comprise an inorganic light-emitting diode electrically connected to the pixel circuit disposed on, in, or over the pixel substrate or pixel circuit. The pixel can comprise a broken (e.g., fractured or separated pixel tether. In some embodiments, the pixel is a heterogeneous integrated module comprising a semiconductor device and a compound semiconductor device, wherein the semiconductor device comprises a semiconductor and the compound semiconductor device comprises a compound semiconductor different from the semiconductor. In some embodiments, (i) the pixel substrate comprises a semiconductor and the pixel circuit is formed in and native to the pixel substrate, or (ii) the pixel substrate is a non-semiconductor substrate (e.g., a glass, plastic, or ceramic substrate) and the pixel circuit is formed in an integrated circuit comprising a circuit substrate non-native to the pixel substrate. At least two rows of pixels can be responsive to a common row light-pipe.

According to embodiments of the present disclosure, an electro-optically controlled imaging system can comprise a system substrate, row wires extending in a row direction disposed on or in the camera substrate, a row controller operable to provide a respective row electrical signal to each of the row wires, column light-pipes extending in a column direction disposed on the system substrate, a column controller operable to receive a respective column optical signal from each of the column light-pipes, and pixels disposed in rows and columns over the system substrate. Each of the pixels can comprise a pixel circuit that is uniquely connected to one of the row wires and that is connected to one of the column light-pipes. The pixel circuit can be operable to receive the respective row electrical signal from the one of the row wires and to transmit the respective column optical signal from the one of the column light-pipes. Some embodiments of the present disclosure comprise one or more row light-pipes extending at least in the row direction disposed on the system substrate. The row controller can be operable to provide a respective row optical signal to each of the row light-pipes. The pixel circuit can be connected to a one of the row light-pipes to receive the respective row optical signal from the one of the row light-pipes.

According to embodiments of the present disclosure, an optically controlled display can comprise a display substrate, row light-pipes extending in a row direction disposed on the display substrate, a row controller operable to provide a respective row optical signal to each of the row light-pipes, column light-pipes extending in a column direction disposed on the display substrate, a column controller operable to receive a respective column optical signal from each of the column light-pipes, and pixels disposed in rows and columns over the display substrate. Each of the pixels can comprise a pixel circuit that is connected to one of the row light-pipes and that is connected to one of the column light-pipes. The pixel circuit can be operable to receive the respective row optical signal from the one of the row light-pipes and to transmit the respective column optical signal into the one of the column light-pipes.

According to embodiments of the present disclosure, an optically controlled imaging system can comprise a system substrate, row light-pipes extending in a row direction disposed on the system substrate, a row controller operable to provide a respective row optical signal to each of the row light-pipes, column light-pipes extending in a column direction disposed on the system substrate, a column controller operable to receive a respective column optical signal from each of the column light-pipes, and pixels disposed in rows and columns over the system substrate. Each of the pixels can comprise a pixel circuit that is connected to one of the row light-pipes and that is connected to one of the column light-pipes. The pixel circuit can be operable to receive the respective row optical signal from the one of the row light-pipes and to transmit the respective column optical signal into the one of the column light-pipes.

According to embodiments of the present disclosure, a display or imaging system can comprise a system substrate, pixels disposed in rows and columns over the system substrate, each pixel comprising one or more light-emitting diodes, and a display controller operable to provide images to the pixels or receive image from the pixels at a frame rate. The frame rate can be no less than 5,000 frames per second, no less than 10,000 frames per second, no less than 20,000 frames per second, no less than 50,000 frames per second, no less than 100,000 frames per second, no less than 200,000 frames per second, no less than 5000,000 frames per second, no less than 1,000,000 frames per second, no less than 10,000,000 frames per second, no less than 20,000,000 frames per second, no less than 50,000,000 frames per second, no less than 100,000,000 frames per second, no less than 200,000,000 frames per second, no less than 500,000,000 frames per second, no less than 1,000,000,000 frames per second, no less than 2,000,000,000 frames per second, no less than 5,000,000,000 frames per second, or no less than 10,000,000,000 frames per second.

According to embodiments of the present disclosure, an optically controlled system can comprise a system substrate, row light-pipes extending in a row direction disposed on the system substrate, a row controller operable to provide a respective row optical signal to each of the row light-pipes, column light-pipes extending in a column direction disposed on the system substrate, a column controller operable to provide a respective column optical signal to each of the column light-pipes or to receive a respective column optical signal from each of the column light-pipes, and pixels disposed in rows and columns over the system substrate. Each of the pixels can comprise a pixel circuit that is connected to one of the row light-pipes and that is connected to one of the column light-pipes. The pixel circuit can be operable (i) to receive the respective row optical signal from the one of the row light-pipes and (ii) to receive the respective column optical signal from the one of the column light-pipes or to transmit the respective column optical signal into the one of the column light-pipes. In some embodiments, the row optical signals comprise or provide a row-select signal. In some embodiments, the row-select signal comprises a row address or a light select indicator. In some embodiments, the row optical signal alternates between a timing (e.g., clock) signal and a row-select signal.

In some embodiments, the row select signal has a row-select frequency that is less than a timing frequency of the timing signal. In some embodiments, the optically controlled system is a display, and the system substrate is a display substrate. In some embodiments, the optically controlled system is an imaging system (e.g., a digital camera) and the system substrate is an imaging substrate.

According to embodiments of the present disclosure, an optically controlled system can comprise a system substrate, one or more row light-pipes extending in a row direction disposed on the system substrate, a row controller operable to provide a respective row optical signal to each of the one or more row light-pipes, column light-pipes extending in a column direction disposed on the system substrate, a column controller operable to provide a respective column optical signal to each of the column light-pipes or to receive a respective column optical signal from each of the column light-pipes, and pixels disposed in rows and columns over the system substrate. Each of the pixels can comprise a pixel circuit that is connected to one of the row light-pipes and that is connected to one of the column light-pipes. The pixel circuit can be operable to (i) receive the respective row optical signal from the one of the row light-pipes and (ii) to receive the respective column optical signal from the one of the column light-pipes or to transmit the respective column optical signal into the one of the column light-pipes.

According to embodiments of the present disclosure, an optically controlled system can comprise a system substrate, a light-pipe, a controller operable to (i) provide an optical signal to the light-pipe, (ii) receive optical signals from the light-pipe, or (iii) both (i) and (ii), and pixels disposed over the system substrate. Each of the pixels can comprise a pixel circuit that is connected to the light-pipe. The pixel circuit can be operable to (i) receive an optical signal from the light-pipe, (ii) to transmit an optical signal into the light-pipe, or (iii) both (i) and (ii).

In some embodiments, a pixel can comprise a pixel circuit operable to respond to a row optical signal and respond to a column optical signal. The pixel circuit can be disposed on, in, or over a pixel substrate. The pixel circuit can comprise a light sensor (e.g., a photosensor or photodiode) operable to detect the row optical signal, a light sensor operable to detect the column optical signal, or both. The pixel circuit can be disposed on, in, or over a pixel substrate and can comprise an optical via that transmits the row optical signal or the column optical signal to the light sensor through the pixel substrate. The pixel can comprise a broken (e.g., fractured) or separated pixel tether. In some embodiments, the pixel is a heterogeneous integrated module comprising a semiconductor device and a compound semiconductor device, wherein the semiconductor device comprises a semiconductor and the compound semiconductor device comprises a compound semiconductor different from the semiconductor. In some embodiments, (i) the pixel substrate comprises a semiconductor and the pixel circuit is formed in and native to the pixel substrate or (ii) the pixel substrate is a non-semiconductor substrate (e.g., a glass, plastic, or ceramic substrate) and the pixel circuit is formed in an integrated circuit comprising a circuit substrate non-native to the pixel substrate. At least two rows of pixels can be responsive to a common row light-pipe.

According to embodiments of the present disclosure, a pixel cluster can comprise a pixel circuit operable to respond to a row optical signal and operable to respond to a column optical signal and a plurality of light emitters that emit light of a same color controlled by the pixel circuit. In some embodiments, the pixel circuit is disposed on, in, or over a pixel cluster substrate. In some embodiments, the pixel circuit comprises a light sensor (e.g., a photosensor or photodiode) operable to detect the row optical signal or a light sensor operable to detect the column optical signal. In some embodiments, the pixel circuit is disposed on, in, or over a pixel cluster substrate and comprises an optical via that transmits the row optical signal or the column optical signal to the light sensor through the pixel cluster substrate. In some embodiments, the pixel circuit can be disposed on, in, or over a pixel cluster substrate, the pixel cluster substrate can be disposed on a display substrate, and the light sensor can be disposed on the display substrate. In some embodiments, the pixel is a heterogeneous integrated module comprising a semiconductor device and a compound semiconductor device. The semiconductor device can comprise a semiconductor and the compound semiconductor device can comprise a compound semiconductor different from the semiconductor. In some embodiments, (i) the pixel cluster substrate can comprise a semiconductor and the pixel circuit can be formed in and native to the pixel cluster substrate or (ii) the pixel substrate can be a non-semiconductor substrate (e.g., a glass, plastic, or ceramic substrate) and the pixel circuit can be formed in an integrated circuit comprising a circuit substrate non-native to the pixel cluster substrate. In some embodiments, at least two rows of pixels are responsive to a common row light-pipe.

According to embodiments of the present disclosure, an optically controlled system can comprise a system substrate, one or more light-pipes disposed on the system substrate, a controller operable to provide optical signals to or receive optical signals from each of the one or more light-pipes, and pixel circuits disposed over the system substrate, wherein each of the pixel circuits comprises a light sensor or a light emitter optically coupled to at least one of the light-pipes. In some embodiments, at least one of the light-pipes has multiple light sensors optically coupled to the at least one of the light-pipes.

Embodiments of the present disclosure provide displays, digital cameras, or systems comprising arrays of functional elements that can operate at very fast frame rates using optical communication through light-pipes.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which.

Figure 1:
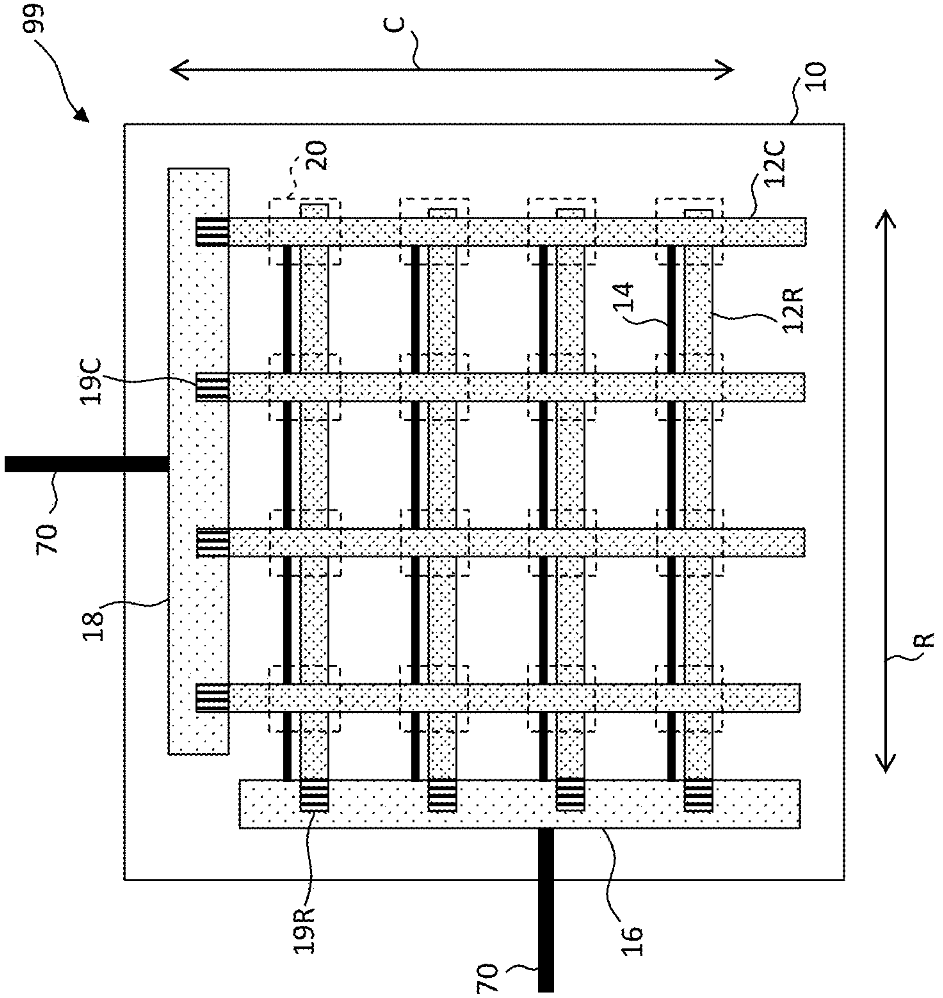
FIG. 1 is a schematic plan view of an electro-optically controlled system comprising pixels, row wires, row light-pipes, and column light-pipes disposed on a system substrate according to illustrative embodiments of the present disclosure.

Features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not necessarily drawn to scale.

DETAILED DESCRIPTION OF CERTAIN EMBODIMENTS

Electrical power and signal distribution over large substrates can suffer from resistive losses and parasitic capacitance that reduce the voltage over the substrate and the frequency at which control or data signals can propagate over the substrate. For example, power and ground signals can have different values at different locations on the substrate and resistive losses, parasitic capacitance, and propagation delays can significantly limit control and data signal frequencies over the substrate. These losses can limit the rate at which information can be provided to or received from functional elements disposed over a large system substrate, such as pixels disposed over a display, camera, or imaging substrate.

There is a need, therefore, for improved system architectures for communicating with arrays of functional elements disposed over a system substrate. Certain embodiments of the present disclosure are directed toward architectures, structures, materials, and methods for improved control, data distribution, or data reception at increased frequencies for functional devices disposed in arrays over the system substrate. In some embodiments of the present disclosure, the functional devices are pixels in a display and the system substrate can be a display substrate. In some embodiments of the present disclosure, the functional devices are sensors in a detector (e.g., light sensors or photosensors in an imaging system such as a digital camera) and the system substrate can be an imaging substrate. Each functional device or component can be a picture element, or pixel, that either emits electromagnetic radiation (such as visible radiation in a display) or absorbs electromagnetic radiation (such as visible light or scintillation in an imaging system). Embodiments of the present disclosure provide control and communication methods and devices that increase the frequency at which pixels can operate and reduce the operational sensitivity of the pixels to variations in supply voltages and ground signals.

According to some embodiments of the present disclosure and with reference to FIG. 1 and the details of FIGS. 2-6, an electro-optically controlled display 99 comprises a display substrate 10, row wires 14 extending in a row direction R disposed on or in display substrate 10, one or more row light-pipes 12R extending at least in the row direction R disposed on or in display substrate 10, a row controller 16 operable to provide a respective row electrical signal to each of row wires 14 and operable to provide a respective row optical signal to each of row light-pipes 12R, column light-pipes 12C extending in a column direction C disposed on or in display substrate 10, a column controller 18 operable to provide a respective column optical signal to each of column light-pipes 12C, and pixels 20 disposed in rows and columns over display substrate 10. In embodiments, each of pixels 20 comprises a pixel circuit 24 that is connected to a unique combination of (i) one of row wires 14, (ii) one of row light-pipes 12R, and (iii) one of column light-pipes 12C. Pixel circuit 24 can be operable to receive (i) the respective row electrical signal from the one of row wires 14, (ii) the respective row optical signal from the one of row light-pipes 12R, and (iii) the respective column optical signal from the one of column light-pipes 12C. Row wires 14 can transmit relatively low frequency signals and row light-pipes 12R can transmit relatively high frequency signals. By combining the use of row wires 14 with row light-pipes 12R, control logic in pixel circuit 24 is simplified and the size of pixel circuit 24 reduced, enabling higher frame rates and pixel density over display substrate 10 in electro-optically controlled display 99.

Figure 2:
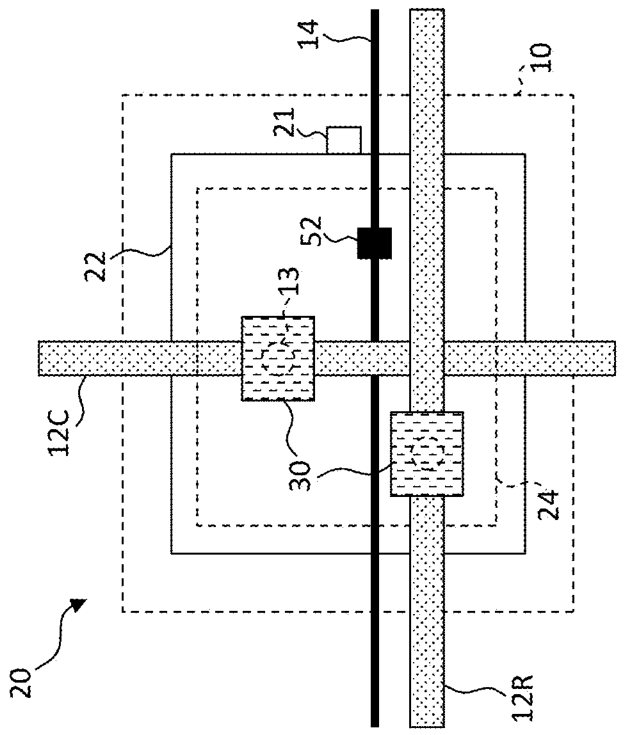
FIG. 2 is a schematic plan view of a light-emitting pixel disposed on a display substrate according to illustrative embodiments of the present disclosure.
Figure 6:
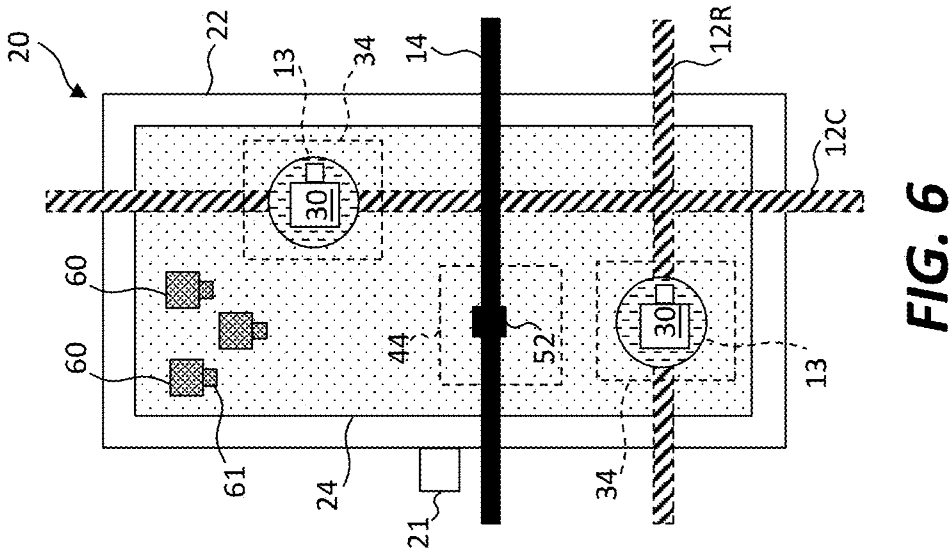
FIG. 6 is a schematic plan view of a display pixel according to illustrative embodiments of the present disclosure.

In some embodiments, the row electrical signals comprise row-select signals, the row optical signals comprise timing signals, the column optical signals comprise data signals, or any combination of these. The row optical signals can have a higher frequency than the row electrical signals, for example ten, one hundred, or one thousand times higher. In some embodiments and as shown in FIGS. 1, 2, and 6, row wires 14 extend substantially orthogonally to column light-pipes 12C over display substrate 10. In some embodiments row light-pipes 12R extend substantially orthogonal to column light-pipes 12C over the display substrate 10 and can extend in a substantially similar or parallel direction to row wires 14.

According to embodiments of the present disclosure, pixels 20 can be arranged in a matrix-addressed array having rows and columns over display substrate 10. The rows and columns of pixels 20 need not be completely straight or regular, for example the rows or columns can have zig-zag shapes or alternating rows or columns can be relatively indented from an edge of display substrate 10. Pixels 20 can be active-matrix pixels 20 that comprise digital logic and data storage in pixel circuit 24. As shown in FIG. 6, pixel circuit 24 can comprise an optical input circuit 34 responsive to a respective column optical signal and to a respective row optical signal. Optical input circuit 34 can comprise one or more light sensors 30 (e.g., photosensors) for receiving optical signals transmitted in column light-pipes 12C and in row light-pipes 12R. Pixel circuit 24 can also comprise an electrical input circuit 44 responsive to a respective row electrical signal. Pixel 20 can comprise one or more inorganic light-emitting diodes 60 (iLEDs 60) electrically connected to and controlled by pixel circuit 24.

Figure 3:
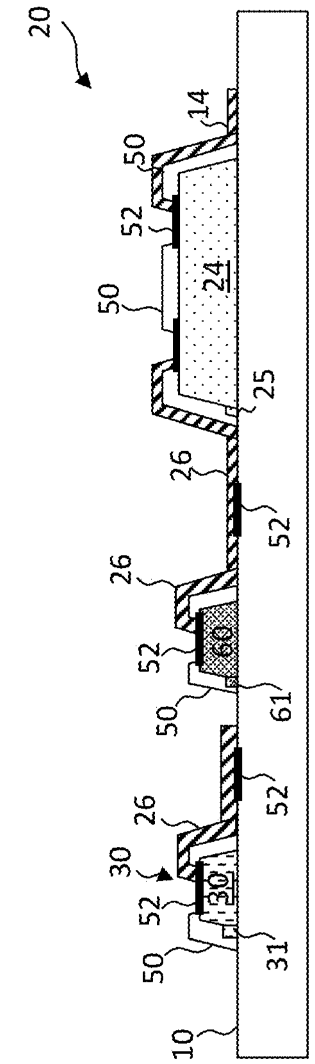
FIG. 3 is a schematic cross section of a pixel with a non-native pixel circuit, a non-native iLED, and a non-native light sensor disposed on a substrate according to illustrative embodiments of the present disclosure.

In some embodiments and as shown in FIG. 3, pixels 20 can be disposed directly on display substrate 10. For example, pixel circuit 24 can be comprised in an integrated circuit micro-transfer printed onto display substrate 10 and can comprise a broken or fractured pixel circuit tether 25 as a consequence of micro-transfer printing onto display substrate 10. Similarly, iLEDs 60 can be micro-transfer printed onto display substrate 10 and can comprise a fractured or separated iLED tether 61 as a consequence of micro-transfer printing. Likewise, light sensors 30 can be micro-transfer printed onto display substrate 10 and can comprise a fractured or separated light-sensor tether 31 as a consequence of micro-transfer printing.

Figure 4:
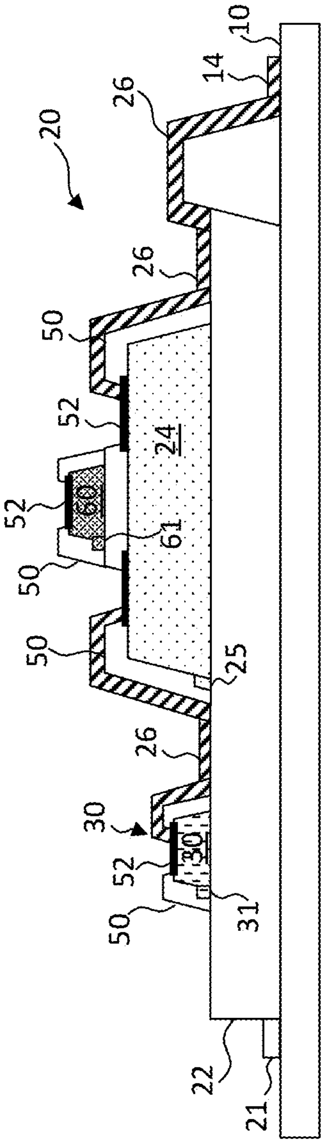
FIG. 4 is a schematic cross section of a pixel with an integrated circuit disposed on and non-native to a pixel substrate, a non-native iLED disposed on the integrated circuit, and a light sensor disposed on the pixel substrate according to illustrative embodiments of the present disclosure.
Figure 5:
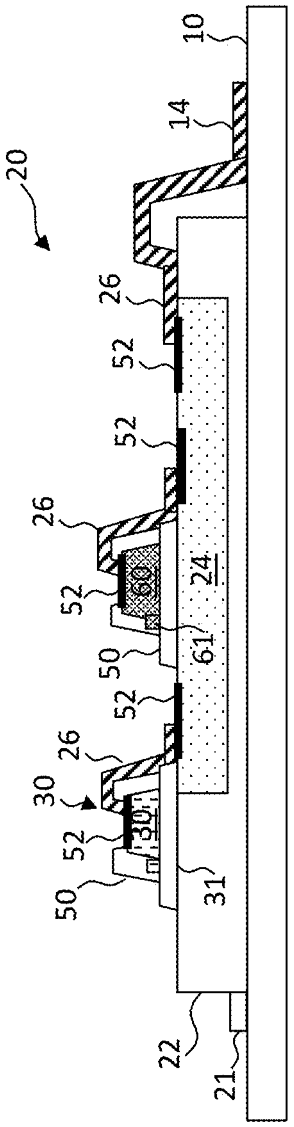
FIG. 5 is a schematic cross section of a pixel with a semiconductor pixel substrate, a pixel circuit formed in and native to the semiconductor pixel substrate, a non-native iLED disposed on the pixel substrate, and a non-native light sensor disposed on the pixel substrate according to illustrative embodiments of the present disclosure.

In some embodiments and as shown in FIGS. 4 and 5, pixels 20 can comprise a pixel substrate 22 non-native to display substrate 10 on which elements of pixel 20 can be disposed, for example pixel circuit 24, one or more inorganic light-emitting diodes 60, and one or more light sensors 30. Micro-transfer printed components can have respective tethers as a consequence of micro-transfer printing, as discussed with respect to FIG. 3. FIG. 5 illustrates embodiments in which pixel substrate 22 comprises a semiconductor material and pixel circuit 24 is formed in or on, and is native to, pixel substrate 22. iLEDs 60 can be disposed on pixel substrate 22 as shown in FIG. 5 or on the integrated circuit of pixel circuit 24, as shown in FIG. 4. Light sensors 30 can be disposed on pixel substrate 22 as shown in FIGS. 4 and 5. Pixel 20 can be a micro-transfer printed structure so that pixel substrate 22 comprises a fractured or separated pixel tether 21 as a consequence of micro-transfer printing pixel 20 to display substrate 10.

In any of the embodiments of FIGS. 3-5, iLEDs 60, pixel circuit 24, and light sensors 30 can be electrically connected with electrodes 26. Pixel circuit 24 can comprise an optical input circuit 34 comprising light sensors 30 (e.g., photosensors, photodiodes, or phototransistors) responsive to the optical signals, e.g., data or timing signals, transmitted on row and column light-pipes 12R, 12C. Pixel circuit 24 can also comprise an electrical input circuit 44 responsive to the row electrical signal, e.g., a row-select signal, on row wire 14 through contact pad 52 (e.g., an electrical connection). Pixel circuit 24 can control iLEDs 60 to emit light in response to received electrical or optical signals, or both. In some embodiments, pixels 20 can receive row-select signals through row wire 14, data signals through light sensor 30 optically connected to column light-pipe 12C, and timing signals through light sensor 30 optically connected to row light-pipe 12R. Although only a single light sensor 30 is shown in FIGS. 3-5, pixels 20 can comprise at least one light sensor 30 optically connected to row light-pipe 12R and one light sensor 30 optically connected to column light-pipe 12C, as shown in FIGS. 2 and 6.

Optical input circuit 34 can be operable to receive optical signals and electrical input circuit 44 can be operable to receive the row-select signal. Optical input circuit 34 and electrical input circuit 44 together produce electrical signals used by pixel circuit 24 to perform the function of pixel circuit 24. Optical input circuit 34 can comprise light sensors 30 and optical structures 13 (e.g., gratings, mirrors, diffusers, or openings) that facilitate optical signal reception by light sensors 30 from each of column light-pipe 12C and row light-pipe 12R. In some embodiments, optical structure 13 is or comprises an interruption in (absence of) a reflective layer coating light-pipes 12, to enable light emission from light-pipe 12. Light sensors 30 convert the optical signals received from column and row light-pipes 12C, 12R through optical structures 13 into electrical signals for pixel circuit 24. Similarly, electrical input circuit 44 is operable to receive electrical signals from row wire 14 for pixel circuit 24, for example through a contact pad 52 for pixel circuit 24.

In embodiments, column controller 18 provides optical signals to column light-pipe 12C, for example data signals specifying a desired luminance for pixel 20 and can comprise an inorganic light-emitting diode 60 or laser for each of column light-pipes 12C that emits light into column light-pipe 12C. In embodiments, row controller 16 provides optical signals to row light-pipe 12R, for example timing signals, and comprises an inorganic light-emitting diode 60 or laser for each of row light-pipes 12R that emits light into row light-pipe 12R. Row controller 16 can also provide electrical signals to row wires 14, for example row-select signals, and can comprise an electrical signal driver, for example a transistor for controlling the row-select signal on each row wire 14.

A light-pipe 12 (e.g., column light-pipe 12C and row light-pipe 12R, collectively light-pipes 12) is a transparent solid material surrounded by an opaque or reflective material or a material having a different refractive index that conducts (transmits) light from a first location to a second location different from the first location. In some embodiments, the transparent solid material can be silicon nitride, silicon dioxide, a polymer, or glass. The surrounding opaque or different-refractive-index material can be silicon, e.g., for silicon photonics and where the conducted light has a frequency greater than infrared, for example visible or ultraviolet light. The silicon material can be a wafer or integrated circuit substrate. In some embodiments, a reflective material surrounding light-pipe 12 can be aluminum, silver, gold, tin, a metal alloy, or other reflective materials. In some embodiments, light-pipes 12 are surrounded at least partially by a different-refractive-index material such as air. In such embodiments, light-pipes 12 can be disposed in or on a wafer or substrate made of any suitable material, including transparent materials such as glass or plastic. Light-pipes 12 can be made using photolithographic, imprinting, or printing processes, e.g., inkjet or extrusion methods. Light can be transmitted from a first location in the substrate or wafer (e.g., in bulk material) to the second location, for example across at least a portion of a wafer or integrated circuit.

In some embodiments, pixels 20 can be formed on or in system substrate 10 (e.g., display substrate 10 or imaging substrate 10), for example comprising thin-film circuits formed in a semiconductor thin-film layer constructed using photolithographic methods, such as those found in the display industry (not shown in the Figures). In some embodiments, pixel circuit 24 comprises a separate integrated circuit, for example formed in a separate integrated circuit with a substrate independent of and non-native to display substrate 10, as shown in FIG. 3. In some embodiments, pixels 20 can comprise a pixel substrate 22, as shown in FIGS. 4 and 5. Pixel circuit 24 can comprise a separate integrated circuit, as show in FIGS. 3 and 4. In some embodiments, pixel substrate 22 can be a semiconductor substrate on or in which pixel circuit 24 is disposed, for example an integrated circuit formed by using photolithographic methods and materials, as shown in FIG. 5. Pixels 20, for example including pixel substrate 22 can be disposed on system substrate 10, for example by micro-transfer printing pixels 20 from a pixel source wafer to system substrate 10. In some embodiments, pixel 20 elements (e.g., pixel circuit 24, light sensors 30, and iLEDs 60 are disposed directly on (e.g., adhered to) display substrate 10.

System substrate 10 can be any suitable display or imaging substrate (e.g., digital camera substrate), for example having a relatively planar surface on which pixels 20, row wires 14, row light-pipes 12R, and column light-pipes 12C can be disposed, for example glass, polymer, sapphire, quartz, metal, ceramic, or substrates found in the display or imaging industries. Row wires 14 can be metal traces disposed on system substrate 10 by evaporation or sputtering and patterned using photolithographic methods and materials, for example mask-exposed photo-resist, etching, and rinsing. Column light-pipes 12C and row light-pipes 12R (collectively light-pipes 12) can comprise patterned and shaped dielectric materials (e.g., silicon dioxide or polymers such as polyimide, resins, or epoxies such as SU-8) that are substantially transparent (e.g., no less than 50% transparent to a frequency of electromagnetic radiation (e.g., light) transmitted through light-pipes 12 or higher) and can be formed using photolithographic methods and materials used in the photonics and silicon photonics industries, or by inkjet deposition or micro-molding methods. Light-pipes 12 can transmit light using total internal reflection or can comprise reflective coatings, such as metal coatings evaporatively deposited and patterned using photolithography.

Row controller 16 and column controller 18 can be separate integrated circuits formed in or disposed on system substrate 10, for example using surface-mount technology. Row controller 16 and column controller 18 can each comprise multiple different circuits, for example different integrated circuits that, together, form corresponding row controller 16 or column controller 18. The different integrated circuits can be unpackaged dies (dice) deposited on system substrate 10, for example by micro-transfer printing. Row controller 16 and column controller 18 can each be electrically controlled through an electrical bus 70 (e.g., a busbar), for example from a controller (not shown in the Figures).

Row controller 16 can comprise an electrical circuit that can provide row electrical signals on row wires 14 to control pixels 20. Row controller 16 can provide electrical signals that energize row light emitters 19R and column controller 18 can provide electrical signals that energize column light emitters 19C (collectively light emitters 19), for example using inorganic light-emitting diodes 60 (iLEDs 60) or diode lasers (e.g., LED lasers) that emit light into each light-pipe 12. Light emitters 19 convert the electrical signals into optical signals (e.g., modulated light or optical pulses) that are emitted into light-pipes 12, for example using structures and methods known in the optical and photonics industries. The row electrical signals propagate along row wires 14 and are received by pixel 20, for example by pixel circuit 24. Row and column optical signals travel through row and column light-pipes 12R, 12C respectively, and are received by pixel 20, for example by light sensors 30, (e.g., a photosensor, photodiode, or phototransistor) that converts the optical signals into electrical signals that are used by pixel circuit 24 to control pixel 20 (e.g., to control iLEDs 60).

In some embodiments, row electrical signals are row-select signals that select a row of pixels 20, row optical signals are timing signals, such as clocks or PWM timing signals that provide timing to a row of pixels 20, and column optical signals are column-data signals that provide data to a column of pixels 20. Row-select signals can carry less information and operate at a lower frequency than the column optical signals. In certain embodiments, because the higher-frequency signals are optical rather than electrical, problems with power and ground distribution and signal integrity over system substrate 10 are reduced or eliminated.

According to some embodiments of the present disclosure, light-pipes 12 can comprise an optical structure 13, such as a light diffuser or light reflector that redirects at least a portion of optical signals from light-pipes 12 to each of light sensors 30 in pixel 20. This can increase the optical response of light-pipes 12 to improve the quality and signal-to-noise ratio of optical signals received by optical input circuit 34.

According to some embodiments of the present disclosure and as shown in FIGS. 4 and 5, pixels 20 can comprise a pixel substrate 22 non-native to (e.g., separate and independent from) system substrate 10. Pixel substrate 22 can be disposed upon system substrate 10 (e.g., a non-native target substrate), for example by micro-transfer printing. Pixel substrate 22 can be adhered to system substrate 10, for example with a layer of adhesive. Electrical connections between pixel circuit 24 on pixel substrate 22 (e.g., electrodes 26) can be formed using photolithographic methods and materials, e.g., patterned metal traces. When transfer printed, pixel substrate 22 can comprise a fractured or separated pixel tether 21.

As shown in FIGS. 3-5, pixel 20 can be a micro-transfer printable or printed pixel 20 comprising a pixel substrate 22 on which a pixel circuit 24 is mounted or formed. Pixel circuit 24 can be insulated with a patterned dielectric structure 50 and electrically connected through exposed electrical contact pads 52 by electrodes 26 that extend over dielectric structure 50 and pixel substrate 22. (For clarity of illustration, FIGS. 3-5 illustrate only some electrodes 26 and do not specify a complete electrical circuit.) Inorganic light-emitting diodes 60 (iLEDs) 60 (for example a red iLED 60 emitting red light when provided with electrical power, a green iLED 60 emitting green light when provided with electrical power, and a blue iLED 60 emitting blue light when provided with electrical power) can be disposed on pixel circuit 24 (e.g., as shown in FIG. 4) or disposed on pixel substrate 22 (as shown in FIGS. 3 and 5). iLEDs 60 can be controlled through signals, for example from pixel circuit 24 through electrodes 26. Pixel 20 can also comprise a light sensor 30, for example a photosensor, electrically connected to and controlled by pixel circuit 24. Light sensor 30 can be disposed on pixel substrate 22 (as shown) or on pixel circuit 24. Electrodes 26 illustrated in FIGS. 3-5 can comprise multiple, electrically independent wires or electrical conductors, e.g., in an electrical bus 70. One or more of iLED 60 and light sensor 30 can comprise a compound semiconductor material and pixel circuit 24 can comprise silicon (e.g., monocrystalline silicon) so that pixel 20 is a heterogeneous integrated module comprising different materials and devices assembled into a common structure or system. Some of the devices can be non-native to system substrate 10, e.g., can be formed in or on a source substrate separate, independent, and distinct from system substrate 10 or pixel substrate 22. Pixel substrate 22 can be non-native to system substrate 10, e.g., can be formed in or on a source substrate separate, independent, and distinct from system substrate 10.

Each iLED 60 can comprise an iLED 60 substrate non-native to (e.g., separate and independent from) system substrate 10 and pixel substrate 22, can be micro-transfer printed onto pixel circuit 24 or pixel substrate 22, and can comprise a fractured iLED tether 61 as a consequence of micro-transfer printing iLED 60. Light sensor 30 can comprise a sensor substrate non-native to (e.g., separate and independent from) system substrate 10 (as shown in FIGS. 3-5), pixel substrate 22, and any iLED 60 substrate. Light sensor 30 can be micro-transfer printed onto pixel circuit 24 or pixel substrate 22 and can comprise a fractured light-sensor tether 31 as a consequence of micro-transfer printing light sensor 30. Similarly, pixel circuit 24 can comprise a pixel circuit 24 substrate non-native to (e.g., separate and independent from) system substrate 10, pixel substrate 22, any iLED 60 substrate, and a sensor substrate, can be micro-transfer printed onto pixel substrate 22, and can comprise a fractured or separated pixel circuit tether 25. Pixel 20, comprising pixel substrate 22, pixel circuit 24, iLEDs 60, and light sensor 30 can also be micro-transfer printed as a unit and can comprise a pixel tether 21.

Pixel circuit 24 can comprise a substrate (e.g., a silicon substrate) non-native to (e.g., separate and independent from) pixel substrate 22 on or in which circuit elements can be formed, optionally including light sensor 30. In some embodiments, light sensor 30 comprises a structure separate and independent of, but electrically connected to, pixel circuit 24.

Figure 7:
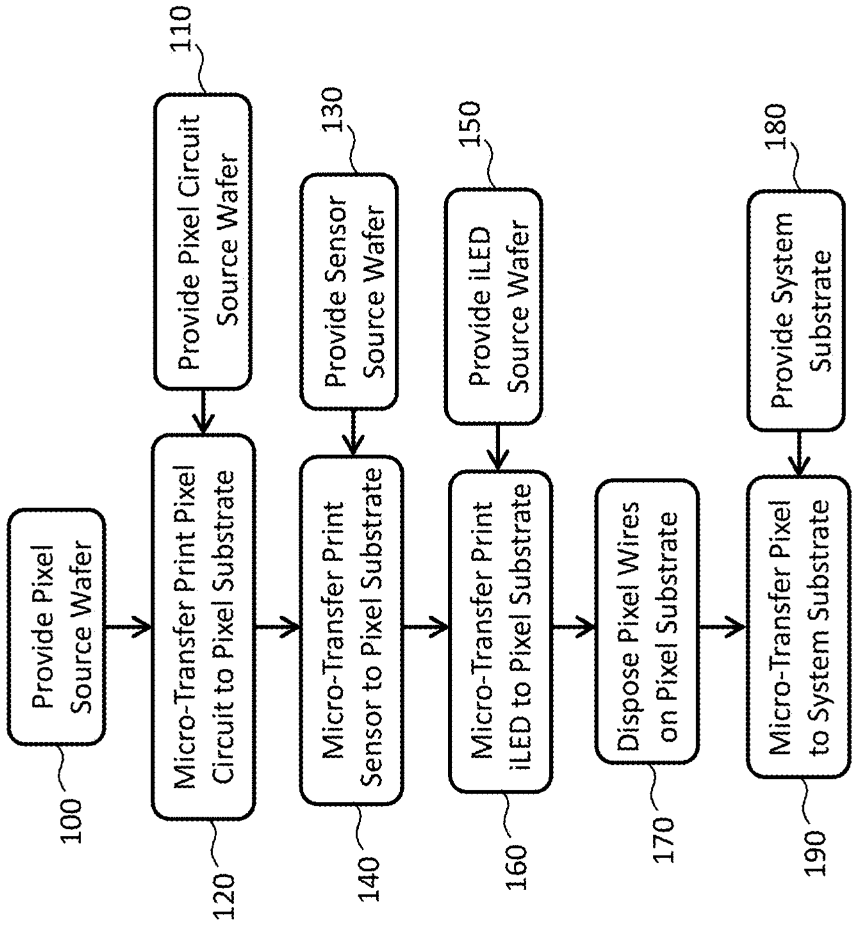
FIG. 7 is a flow diagram according to illustrative embodiments of the present disclosure.

As shown in the flow diagram of FIG. 7, embodiments of the present disclosure can be constructed by providing a pixel source wafer in step 100. The pixel source wafer can comprise an array of pixel substrates 22 that can be released for micro-transfer printing. In some embodiments, pixel circuit 24 can be formed in or on pixel substrate 22, for example if pixel substrate 22 comprises a semiconductor such as silicon. In some embodiments, a pixel source wafer comprising micro-transfer printable pixel circuits 24 is provided in step 110 and pixel circuits 24 are micro-transfer printed to pixel substrate 22 in step 120. If optical column data communication is desired, a sensor source wafer comprising micro-transfer printable light sensors 30 (and, optionally, light-sensor circuits) can be provided in step 130 and printable light sensors 30 are micro-transfer printed to pixel substrate 22 (or onto pixel circuit 24) in step 140. One or more iLED 60 source wafers comprising micro-transfer printable iLEDs 60 (for example emitting different colors of light) is provided in step 150 and iLEDs 60 are micro-transfer printed to pixel substrate 22 (or onto pixel circuit 24) in step 160. In step 170, electrodes 26 are disposed on or over pixel substrate 22 to electrically connect pixel circuit 24, printable light sensors 30, and iLEDs 60, for example by evaporating metal onto pixel substrate 22 and patterning the metal using photolithographic methods and materials, to complete pixel 20. Optionally, an encapsulating layer is provided over pixel 20. Pixel 20 can be micro-transfer printed to a system substrate 10 (provided in step 180 together with any system substrate 10 wires such as row wires 14, column wires 15, or column light-pipes 12C, and contact pads 52) in step 190.

According to embodiments of the present disclosure, a controller (not shown) of an electro-optically controlled system 99 can operate pixels 20 by providing control and data signals to row controller 16 and data signals to column controller 18. In response, row controller 16 provides row electrical signals on row wires 14 that are sensed by electrical input circuit 44 (for example directly through contact pad 52). Row controller 16 also provides row electrical signals that are converted by row light emitters 19R into optical data signals transmitted into row light-pipes 12R that are sensed by optical input circuit 34 in pixel 20. Column controller 18 provides column electrical signals that are converted by column light emitters 19C into optical data signals transmitted into column light-pipes 12C that are sensed by optical input circuit 34 in pixel 20. Optical input circuit 34 and electrical input circuit 44 then provide electrical control signals to control circuits in pixel circuit 24 that operate pixel 20, for example by providing controlled current to iLEDs 60 for specified amounts of time, for example corresponding to pixel data signals. Row controller 16 can sequentially energize row wires 14 to select corresponding rows with row-select signals, row controller 16 can provide timing signals to selected rows simultaneously with the row-select signals, and column controller 18 can provide column-data signals to each column simultaneously, so that each row of pixels 20 receives column data at the same time and sequential rows of pixels 20 sequentially receive column data. Once a row of pixels 20 receives data, the pixels 20 in the row can control iLEDs 60 to emit light according to the received data.

Figure 8:
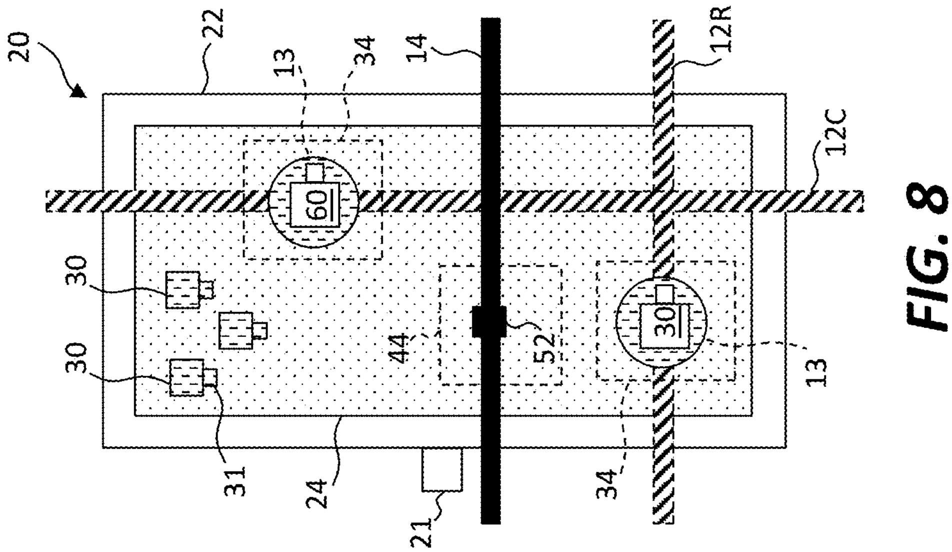
FIG. 8 is a schematic plan view of a light-sensing pixel disposed on a pixel substrate according to illustrative embodiments of the present disclosure.
Figure 9:
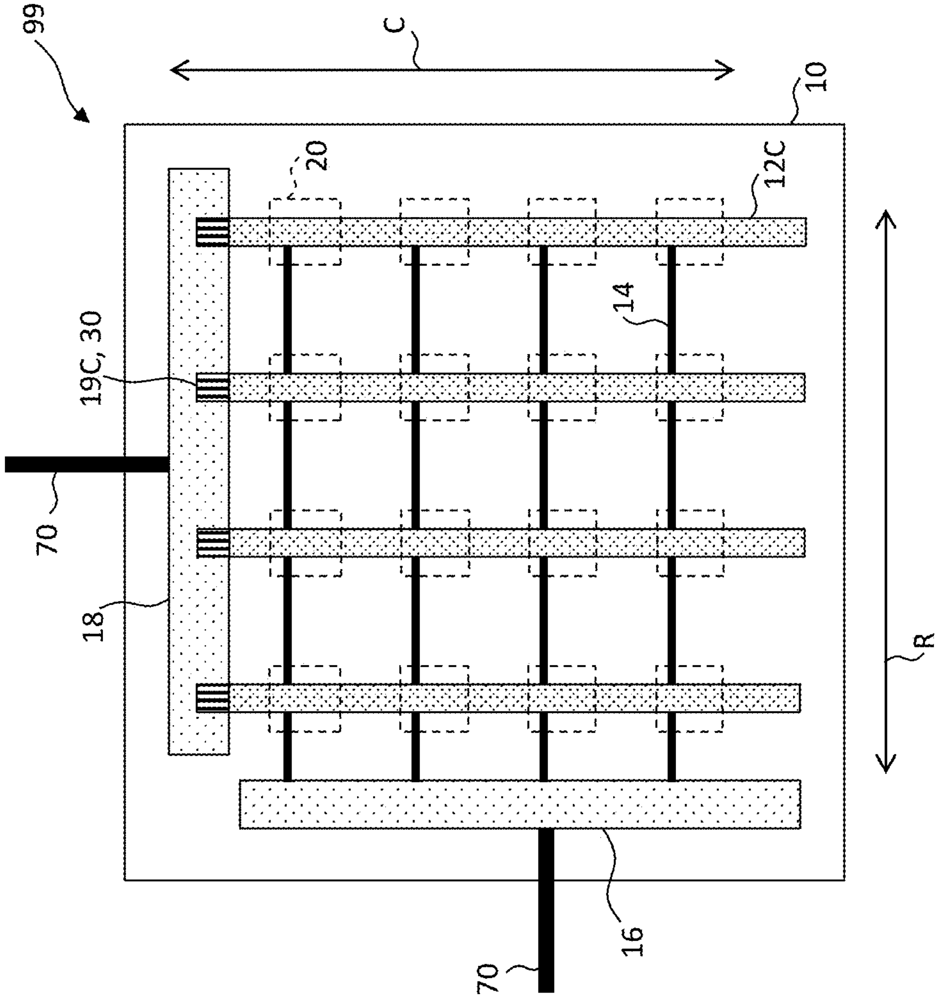
FIG. 9 is a schematic plan view of an electro-optically controlled system comprising row wires, column light-pipes, and pixels disposed on a substrate according to illustrative embodiments of the present disclosure.
Figure 10:
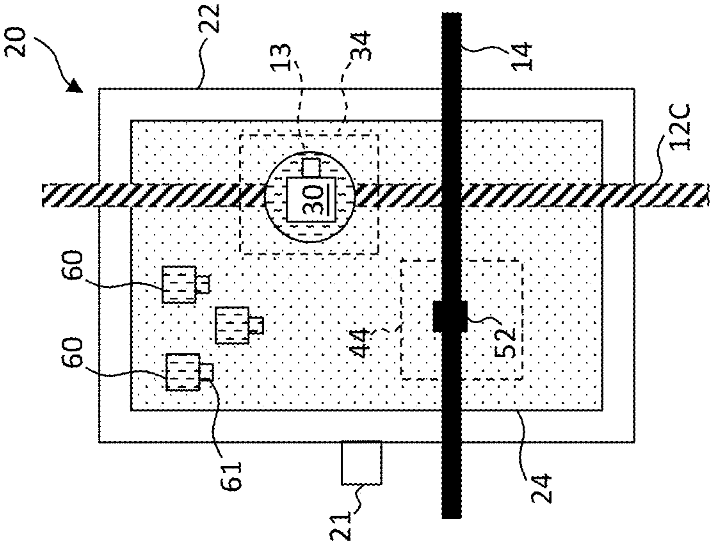
FIG. 10 is a schematic plan view of a light-sensing pixel disposed on a pixel substrate according to illustrative embodiments of the present disclosure.

In some embodiments, pixels 20 can comprise one or more light-emitters controlled by pixel circuit 24, for example inorganic light-emitting diodes 60, and electro-optically controlled system 99 can be a display. In some embodiments and as illustrated in FIGS. 8 and 9, pixels 20 can comprise one or more light sensors 30 (e.g., photosensors responsive to various light frequencies) controlled by pixel circuit 24, for example photo-diodes or photo-transistors sensitive to electromagnetic radiation, and electro-optically controlled system 99 can be an imaging system (e.g., in an embodiment analogous to FIGS. 1-6 in which display substrate 10 is an imaging or camera substrate 10 and pixels 20 comprise light sensors 30 to receive ambient radiation and in which iLEDs 60 or lasers emit light into column light-pipe 12C rather than receiving light). Likewise, column controller 18 can receive optical signals (e.g., imaged data) using a light sensor 30 rather than a column light emitter 19C. Light sensors 30 can be responsive to visible light, infrared light, or ultra-violet light, or other suitable frequencies of electromagnetic radiation. Pixels 20 can be arranged in an array over or on system substrate 10, for example a regular two-dimensional array, and column direction C can be orthogonal to row direction R over system substrate 10 so that row wires 14 are substantially orthogonal to column light-pipes 12C (e.g., to within 5 degrees or to within the limitations of a manufacturing process). FIG. 9 illustrates embodiments in which no row light-pipes 12R are used to provide timing signals, but in some embodiments row controller 16 can be operable to provide optical signals to row light-pipe 12R, for example timing signals and can comprise an inorganic light-emitting diode 60 that emits light into each of row light-pipes 12R (as in FIGS. 1-6). FIG. 10 illustrates a pixel comprising a pixel circuit 24 for receiving electrical signals on row wire 14 and optical signals on column light-pipe 12C. The system of FIGS. 8 and 9 can be constructed using methods that are the same as, or similar to, those for constructing the displays described above.

Thus, embodiments of the present disclosure can include an electro-optically controlled imaging system as shown in FIG. 9, such as a camera, comprising a system substrate 10, row wires 14 extending in a row direction R disposed on or in system substrate 10, a row controller 16 operable to provide a respective row electrical signal to each of row wires 14 (e.g., a row-select signal), column light-pipes 12C extending in a column direction C disposed on system substrate 10, a column controller 18 operable to receive a respective column optical signal from each of column light-pipes 12C, and pixels 20 disposed in rows and columns over system substrate 10. Each of pixels 20 can comprise a pixel circuit 24 that is uniquely connected to one of row wires 14 and one of column light-pipes 12C. Pixel circuit 24 can be operable to receive the respective row electrical signal from the one of row wires 14 and transmit a respective column optical signal into the one of column light-pipes 12C. The optical signal can specify light received by light sensor(s) 30 in pixel 20. Some embodiments (e.g., as shown in FIG. 1 and FIG. 8) comprise one or more row light-pipes 12R extending at least in the row direction R disposed on system substrate 10. Row controller 16 can be operable to provide a respective row optical signal to each of row light-pipes 12R and pixel circuit 24 can be connected to a one of row light-pipes 12R to receive the respective row optical signal from the one of row light-pipes 12R.

In embodiments of the present disclosure, a display or imaging (camera) system can operate at very high frame rates, where each frame consists of a displayed or imaged (received) image. In conventional displays, images are shown (displayed) on the display at 60, 120, 240, or 480 frames per second, for example to provide an illusion to a viewer of smooth motion from a consecutive series of still images. However, in some embodiments, displays can be used to convey information, e.g., binary information, at a much higher frame rate to a camera system rather than to a human to provide a high data-rate communication system, e.g., a free-space optical communication system. In such systems, high (large) bandwidth is important.

Embodiments of the present disclosure can provide high-bandwidth optical communication components or high-bandwidth optical communication systems. It can, for example, be difficult to reliably provide an electrical signal at more than 20 MHz over a large substrate to an array of functional elements given the physical distance such signals must travel over the large substrate, the density of the functional elements, and the available wire size for carrying the electrical signals. Thus, in a simplistic example, a display system for communicating binary data over an HD display (2 k columns by 1 k rows of pixels 20) can have a frame rate of 20 kHz (20 MHz divided by 1000 rows) and a data rate of 40 GHz (20 kHz×2 k columns×1 k rows or 20 MHz×2 k columns). In embodiments of the present disclosure, rather than loading a single bit (at 20 MHz) into each row of a display, pixels 20 can receive optical data and timing signals at much higher data rates, for example pixel values of 40 bits at a data rate of 800 MHz. iLEDs 60 can readily turn on and off at such rates; embodiments of the present disclosure, according to this example, can provide data rates of 1.6 THz. A 4 k or 8 k display can provide correspondingly increased data rates.

Thus, according to embodiments of the present disclosure, a display can comprise a display substrate 10 with pixels 20 disposed in rows and columns over display substrate 10, and a display controller (e.g., row and column controllers 16, 18) operable to provide images to pixels 20 at a frame rate. Each pixel 20 can comprise one or more inorganic light-emitting diodes 60. In embodiments, the display has a frame rate no less than 5,000 frames per second, no less than 10,000 frames per second, no less than 20,000 frames per second, no less than 50,000 frames per second, no less than 100,000 frames per second, no less than 200,000 frames per second, no less than 500,000 frames per second, no less than 1,000,000 frames per second, no less than 10,000,000 frames per second, no less than 20,000,000 frames per second, no less than 50,000,000 frames per second, no less than 100,000,000 frames per second, no less than 200,000,000 frames per second, no less than 500,000,000 frames per second, no less than 1,000,000,000 frames per second, no less than 2,000,000,000 frames per second, no less than 5,000,000,000 frames per second, or no less than 10,000,000,000 frames per second.

Figure 11:
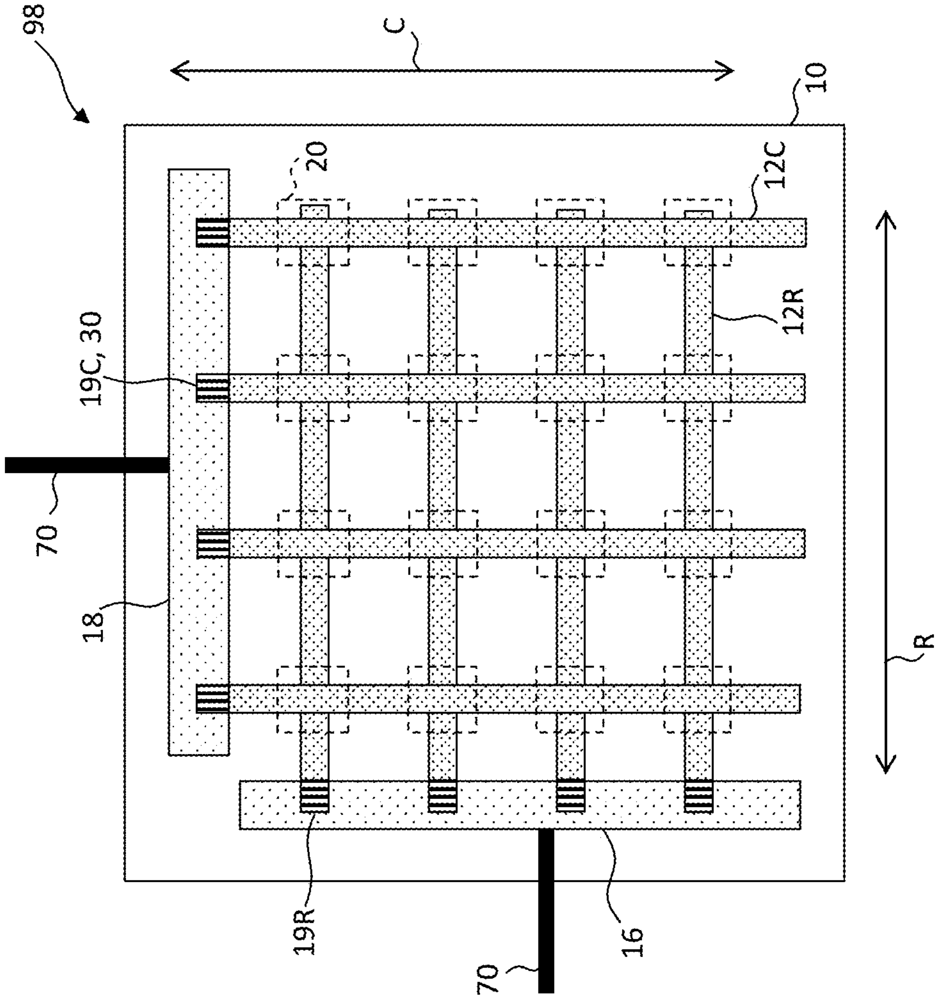
FIG. 11 is a schematic plan view of an optically controlled system comprising row light-pipes, column light-pipes, and pixels disposed on a substrate according to illustrative embodiments of the present disclosure.

The embodiments of FIGS. 1-9 can use an electrical row-select signal at a relatively low frequency (e.g., compared to optical signals) for selecting rows of pixels 20 that are provided with higher-rate optical data signals through column light-pipes 12C and higher-rate optical timing signals through row light-pipes 12R. In other embodiments of the present disclosure and as shown in FIG. 11, row-select signals are provided optically through row light-pipes 12R. If row light-pipes 12R transmit timing signals, a row-select signal can be added to or embedded within the timing signals. For example, an optical timing signal could comprise a one GHz clock signal. At each frame time, a single long pulse having a period greater than one nanosecond can indicate the beginning of a new frame for a row of pixels 20, e.g., the long pulse can form a row-select signal. Pixel circuit 24 in each pixel 20 can detect the long pulse and input optical signals provided on column light-pipes 12C in response, so that the row optical signal comprises both a row-select and a timing signal. In some embodiments, a clock can be derived from the optical data signal or generated internally within pixel circuit 24, and the presence of an optical signal (e.g., without any encoding), can serve as a row-select signal.

In such embodiments, frame rates are no longer limited by the rate at which electrical signals can be reliably transmitted over a relatively large display substrate 10. For example, optical signals can be communicated at 10 GHz (10 Gbps). For a 2 k by 1 k display operating at a 1 MHz frame rate, a period of a row-select signal can be 1 nsec, a signal more readily communicated over a large system substrate using optics rather than electronics. At a 10 GHz optical data rate, a 2 k×1 k display could transmit binary data at 20 THz and an 8*k* display could transmit binary data at 80 THz.

Figure 12:
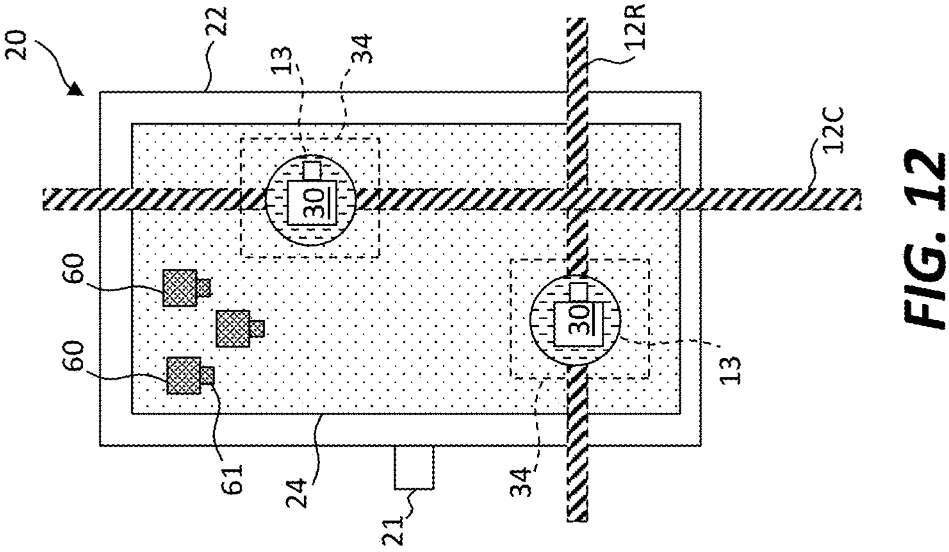
FIG. 12 is a schematic plan view of an optically controlled light-emitting pixel disposed on a pixel substrate according to illustrative embodiments of the present disclosure.

FIGS. 11 and 12 illustrate optically controlled embodiments of the present disclosure. As shown in FIGS. 11 and 12, an optically controlled system 98 (e.g., an optically controlled display 98) can comprise a system substrate 10 (e.g., a display substrate 10 or imaging substrate 10 such as a digital camera substrate), row light-pipes 12R extending in a row direction R disposed on system substrate 10, a row controller 16 operable to provide a respective row optical signal to each of row light-pipes 12R, column light-pipes 12C extending in a column direction C disposed on system substrate 10, a column controller 18 operable to provide a respective column optical signal to each of column light-pipes 12C or to receive a respective column optical signal from each of column light-pipes 12C, and pixels 20 disposed in rows and columns over system substrate 10. Each of pixels 20 can comprise a pixel circuit 24 that is connected to one of row light-pipes 12R and that is connected to one of column light-pipes 12C. Pixel circuit 24 can be operable to receive the respective row optical signal from the one of the row light-pipes 12R, and to receive the respective column optical signal from the one of the column light-pipes 12C or to transmit a respective column optical signal into the one of the column light-pipes 12C. Each pixel 20 can be uniquely connected to a combination of a row light-pipe 12R and a column light-pipe 12C.

In some embodiments, the row optical signals comprise or provide a row-select signal. The row optical signal can alternate between a timing (e.g., clock) signal and a row-select signal and the row select signal can have a row-select frequency that is less than a timing frequency of the timing signal.

Figure 13:
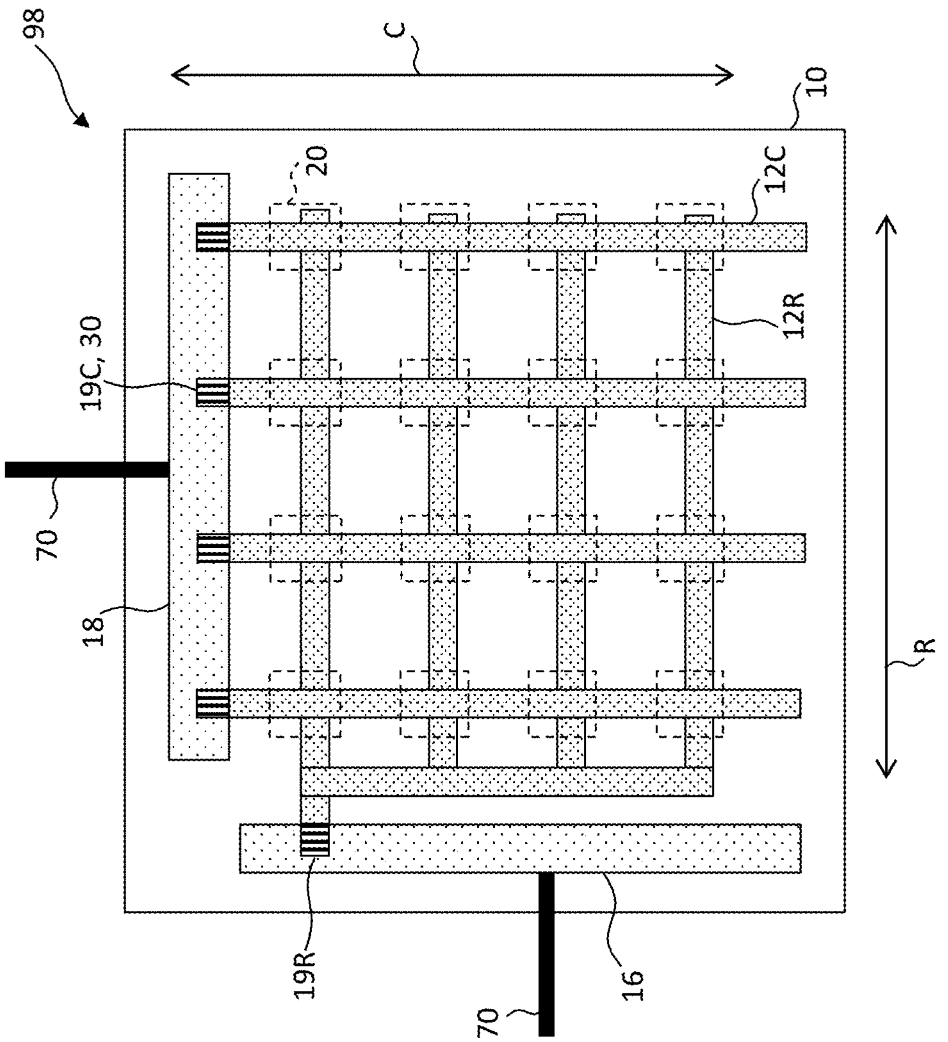
FIG. 13 is a schematic plan view of an optically controlled system with a single row light-pipe and comprising pixels disposed on a substrate according to illustrative embodiments of the present disclosure.

In some embodiments of the present disclosure and as shown in FIG. 13, the row-select signal is or comprises a row address specifying the row for which column data is intended. For example, a low-frequency optical signal can indicate an address and the immediately following optical bits can specify the row in the display. In such embodiments, separate row light-pipes 12R for each row of pixels 20 are unneeded and a single row light-pipe 12R can communicate the row address to all of pixels 20 or to groups of pixel 20 rows. Row addresses can be specified in a setup phase or hardwired in pixel 20, for example using FPGA circuits and structures such as laser-programmable or electrically-programmable links or connections in pixel 20, for example on pixel substrate 22 or in pixel circuit 24. Pixels 20 can then receive the optical row address signal and, if the row address matches the pixel 20 row, the optical data signal provided on column light-pipes 12C is input and used to control iLEDs 60. If the row address does not match the pixel 20 row, then the optical data signal is ignored. Using fewer separate row light-pipes 12R reduces the amount of driver circuitry (e.g., row light emitters 19R) needed for a system.

Figure 14:
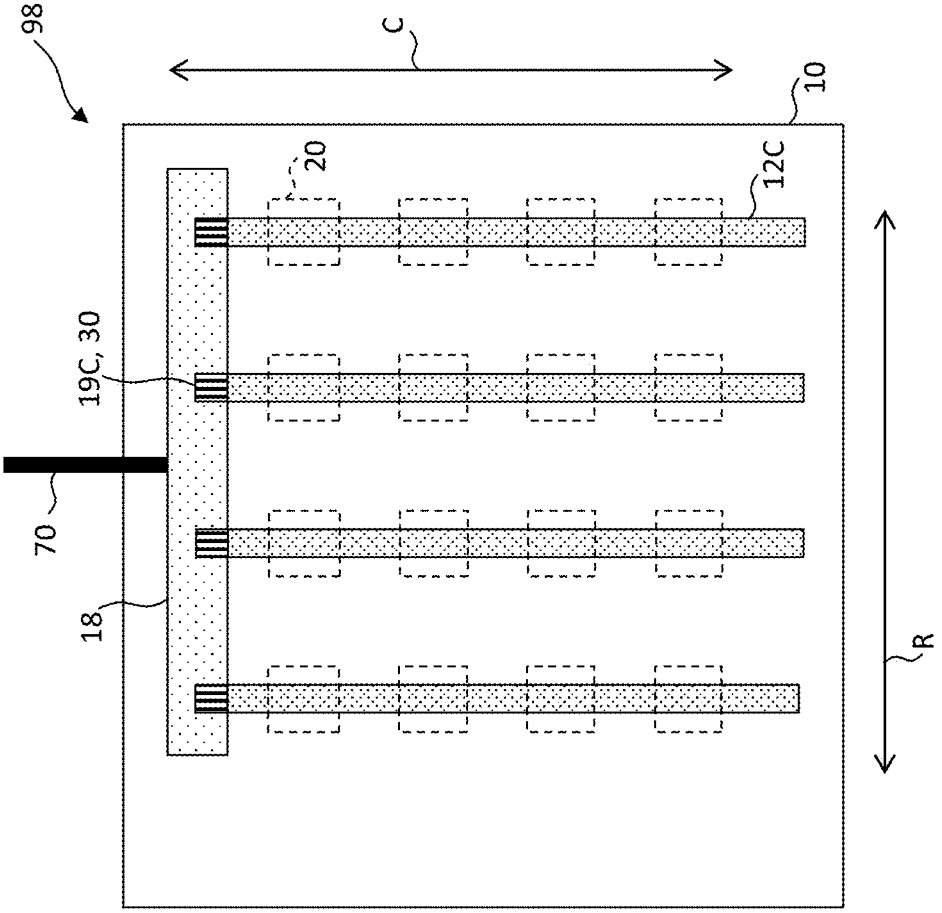
FIG. 14 is a schematic plan view of an optically controlled system with only column light-pipes and comprising pixels disposed on a substrate according to illustrative embodiments of the present disclosure.

In other all-optical embodiments of the present disclosure, an all-optically controlled system 98 (display or imaging system such as a digital camera) can dispense with row light-pipes 12R entirely and rely solely on column light-pipes 12C to communicate with pixels 20, as shown in FIG. 14, reducing the amount of circuitry and optical drivers (e.g., row light emitters 19R) needed and thus reducing the cost of the system. In such an embodiment, all control signals are transmitted to pixels 20 through column light-pipes 12C using column controller 18. Row address and timing signals can be derived from or added to optical data signals to indicate to pixels 20 in rows which optical data signals should be input by the pixels 20 in the row. The achievable data rate for pixels 20 is only slightly reduced because of the additional address overhead.

Figure 15:
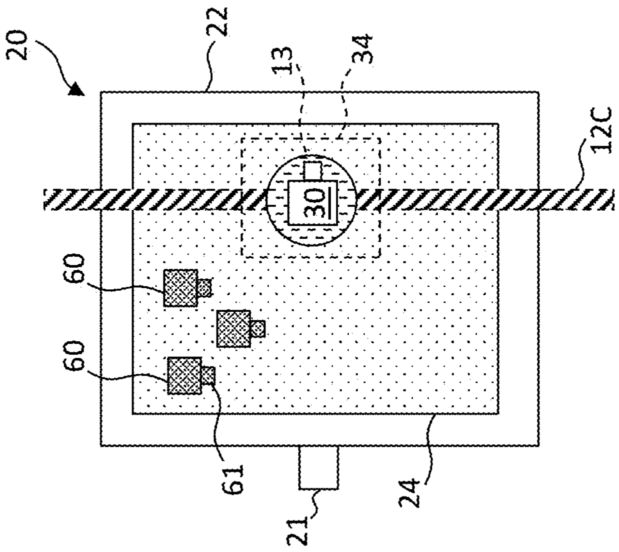
FIG. 15 is a schematic plan view of an optically controlled light-emitting pixel disposed on a pixel substrate according to illustrative embodiments of the present disclosure.

As shown in FIG. 14, an optically controlled system 98 can comprise a system substrate 10, column light-pipes 12C extending in a column direction C disposed on system substrate 10, a column controller 18 operable to provide a respective column optical signal to each of column light-pipes 12C or to receive a respective column optical signal from each of column light-pipes 12C, and pixels 20 disposed in rows and columns over system substrate 10. Each of pixels 20 can comprise a pixel circuit 24 that is connected to one of column light-pipes 12C. As shown in FIG. 15, pixel circuit 24 can be operable to receive the respective column optical signal from the one of column light-pipes 12C or to transmit the respective column optical signal into the one of the column light-pipes 12C. In operation as a display, column controller 18 transmits control and data signals into column light-pipes 12C and pixel 20 receives the control and data signals and controls iLEDs 60 in response to the control and data signals. In operation as an imaging system (e.g., a digital camera), pixels 20 receive image data using light sensors 30, transmits the data signals into column light-pipes 12C and column controller 18 receives the data signals from column light-pipes 12C.

Figure 16:
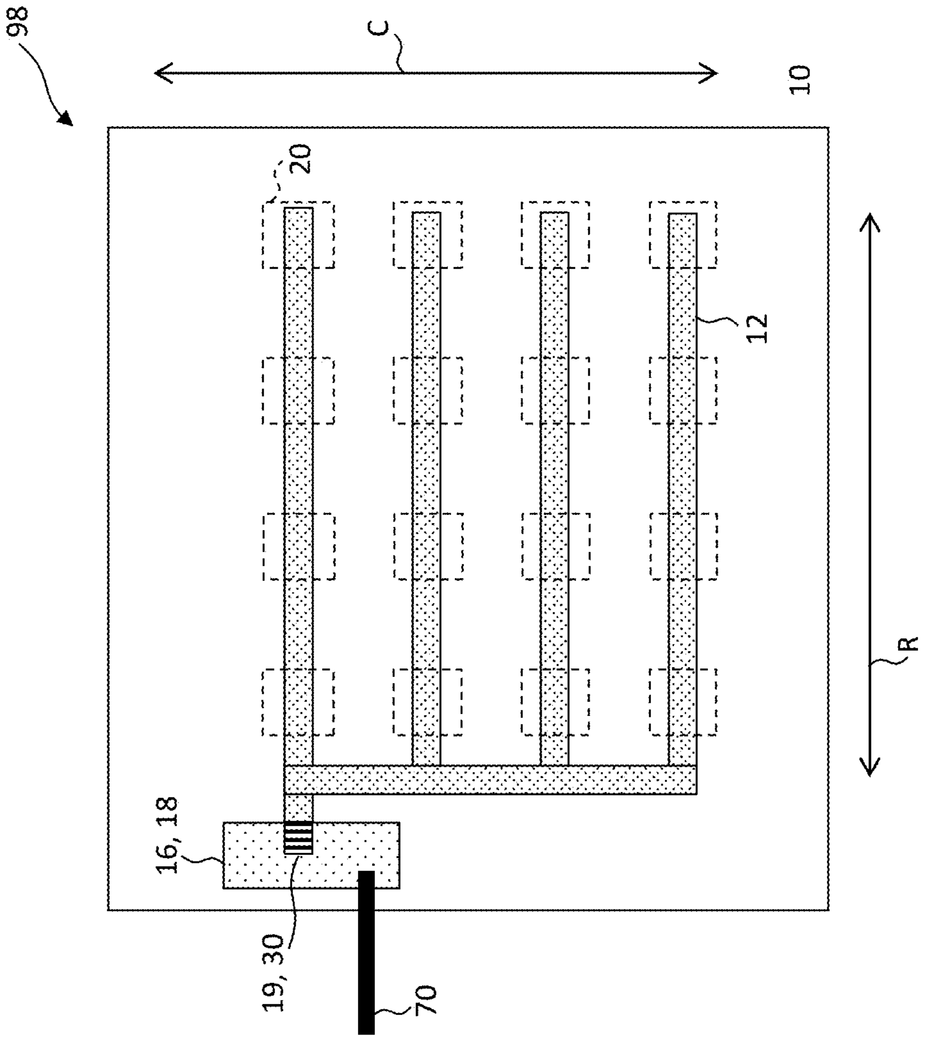
FIG. 16 is a schematic plan view of an optically controlled system with only one light-pipe and comprising pixels disposed on a substrate according to illustrative embodiments of the present disclosure.

As illustrated in embodiments such as are shown in FIG. 16 (and FIG. 15), an all-optically controlled system 98 (display or imaging system such as a digital camera) can dispense with row or columns of light-pipes 12R, 12C and relay solely on a single light-pipe 12 to communicate with pixels 20, or at least on fewer light-pipes 12 than there are pixels 20, rows of pixels 20, or columns of pixels 20, or a combination of these, reducing the amount of circuitry and optical drivers (e.g., row and column light emitters 19R, 19C) needed and thus reducing the cost of the system. In such an embodiment, all control signals and data signals are transmitted to pixels 20 or received from pixels 20 through light-pipe(s) 12. Address and timing signals can be derived from or added to optical data signals. Such reduced (or single) light-pipe 12 systems can provide adequate data rates for displays or digital cameras because the optical data rate through light-pipe 12 is so high compared to the number of pixels 20. For example, a three-color 2 k display using 12 bits at 120 frames per second for each displayed or sensed image pixel 20 can require communication rates of approximately 8.6 GHz, a rate achievable with an optical system.

As shown in FIG. 16, an optically controlled system 98 can comprise a system substrate 10, a light-pipe 12, a controller (e.g., combining the operation of row controller 16 and column control 18) operable to provide an optical signal to light-pipe 12, for example using light emitter 19, or receive optical signals from light-pipe 12, for example using light sensor 30, and pixels 20 disposed over system substrate 10. Each of pixels 20 can comprises a pixel circuit 24 that is connected to light-pipe 12. Pixel circuit 24 can be operable to receive an optical signal from light-pipe 12 or to transmit an optical signal into light-pipe 12, or both. The optical signal can encode pixel data for iLEDs 60 as well as pixel 20 address data and timing information. Pixel circuit 24 can be operable to decode the optical signal and control iLEDs 60 in response to the decoded signal. Such a design readily supports an update-on-demand (pixel refresh-on-demand) control scheme in which data is transmitted only to pixels 20 when the pixel 20 data changes, reducing power required if the displayed data is relatively unchanging.

Figure 17B:
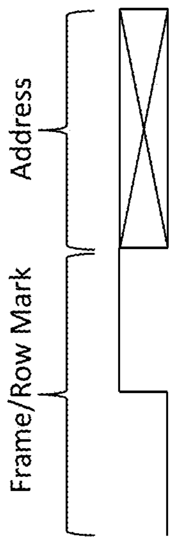
FIGS. 17A-17D are illustrative timing diagrams for pixels or rows of according to illustrative embodiments of the present disclosure.
Figure 17A:
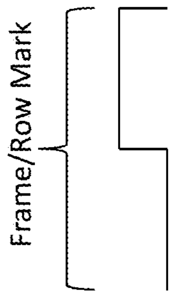

FIG. 17A shows an illustrative optical signal with a frame or row mark (e.g., a row-select signal) transmitted to a row of pixels 20. Once the signal is received, the pixels 20 in the row can input, store, and display a corresponding optical data signal value from a corresponding column light-pipe 12C, for example as shown in FIGS. 11 and 12. The received frame or row mark (row-select) signal can be edge-triggered to denote that new data or a frame is available and to indicate that data should be displayed as long as the signal is high. (The signals can use either positive or negative logic; high and low are arbitrary signal designations.)

FIG. 17B shows an illustrative optical signal with a frame or row mark (e.g., a row-select signal) followed by a row address transmitted to multiple rows of pixels 20. Once the signal is received, the pixels 20 in the rows can read the row address and, if the read address matches the pixel 20 row address, input, store, and display a corresponding optical data signal value from a corresponding column light-pipe 12C, for example as shown in FIGS. 13-14. If the row address does not match, the optical data signal is ignored. FIG. 17B also illustrates embodiments in which the optical signal with a frame or row mark (e.g., a row-select signal) followed by a pixel 20 address is transmitted to multiple pixels 20 in any row. Once the signal is received, the pixels 20 in the rows can read the received pixel 20 address and, if the received pixel 20 address matches the pixel 20 address, input, store, and display a corresponding optical data signal value from a corresponding column light-pipe 12C, for example as shown in FIG. 6. If the pixel 20 address does not match, the optical data signal is ignored.

Figure 17C:
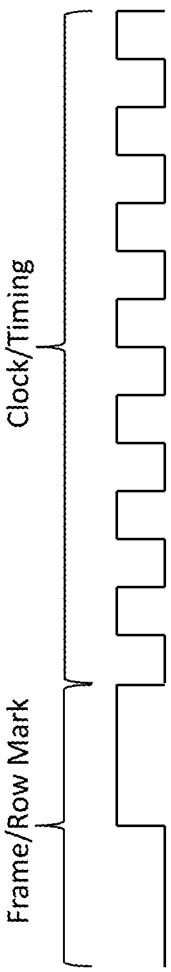
Figure 17D:
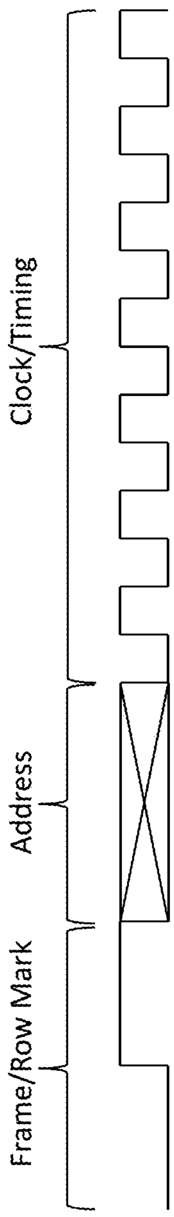

FIG. 17C shows an illustrative optical signal with an embedded frame or row mark (e.g., a row-select signal) transmitted to a row of pixels 20. As shown in FIG. 17C, an initial low-frequency optical signal indicating that data is available for the row of pixels is followed by a clock or other timing signal that assists in reading a corresponding optical data signal transmitted on a column light-pipe 12C and operable as described with respect to FIG. 17A. The clock or timing signal can incorporate a pulse-width modulation signal. FIG. 17D illustrates an optical signal with a row or pixel address added to the illustrative optical signal of FIG. 17C and operable as described with respect to FIG. 17B.

Figure 18A:
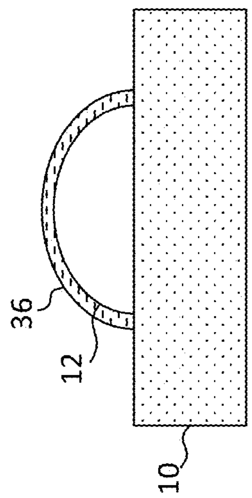
FIG. 18A is a schematic cross section of a light-pipes on a substrate in a direction perpendicular to the direction of light propagation and FIG. 18B is a schematic cross section of a light-pipes on a substrate in a direction parallel to the direction of light propagation according to illustrative embodiments of the present disclosure.
Figure 18B:
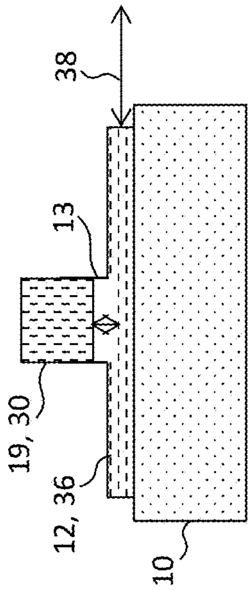

FIGS. 18A and 18B illustrate light-pipe 12 coated with a reflective layer 36 (e.g., such as silver or aluminum) on a system substrate 10. FIG. 18B shows optical structure 13 from which light 38 propagating along light-pipe 12 can emerge from light-pipe 12 and be detected by light sensor 30. In some embodiments, light 38 from light emitter 19 can be sent into light-pipe 12 through optical structure 13.

Figure 19:
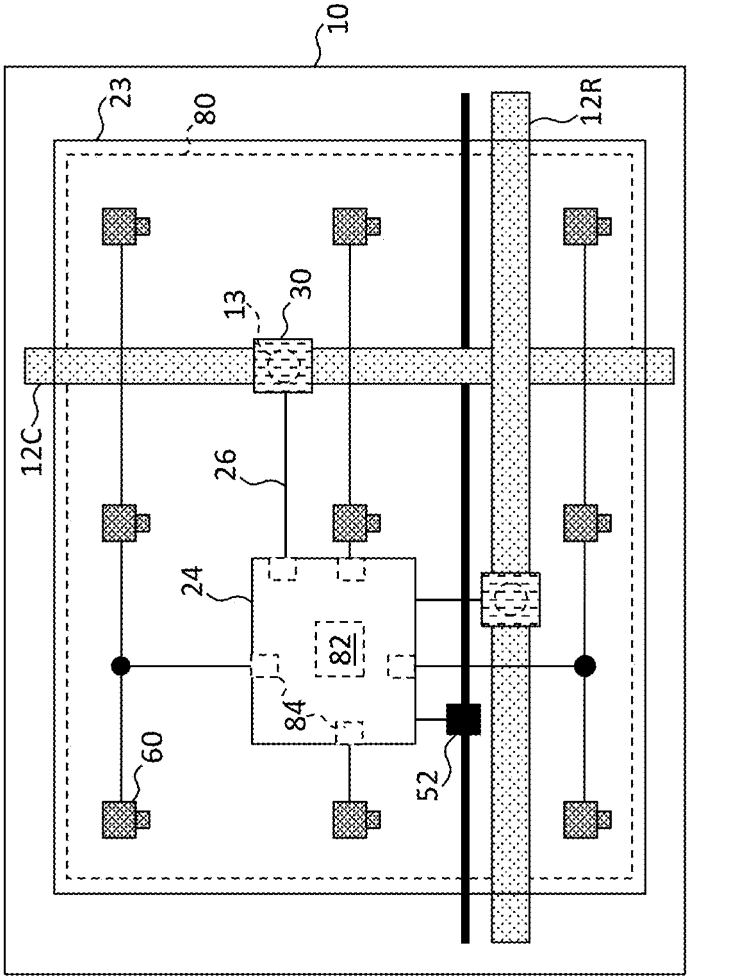
FIG. 19 is a schematic diagram of a pixel cluster with light sensors disposed on the pixel substrate according to illustrative embodiments of the present disclosure.

In embodiments of the present disclosure and as illustrated in FIG. 19, multiple iLEDs 60 can be disposed in pixel clusters 80 controlled by a single pixel circuit 24. Pixel circuit 24 can be connected to row and column light-pipes 12R, 12C with light sensors 30 and optional optical structures 13 and to row wire 14 (if present) through contact pads 52 or other electrical connections. Pixel circuit 24 can control iLEDs 60 with passive- or active-matrix control. iLEDs 60 in pixel clusters 80 can be arranged in a regular array, for example in a two-dimensional or one-dimensional array and pixel clusters 80 can be arranged in a regular array so the iLEDs 60 in pixel clusters 80 form a regular array over display substrate 10. iLEDs 60 can emit different colors of light to provide multi-color pixels 20. Pixel clusters 80 can be disposed on pixel cluster substrate 23 on display substrate 10 or pixel clusters 80 can be disposed on display substrate 10. Pixel circuit 24 in pixel cluster 80 can comprise a pixel memory 82 to store pixel data and pixel drivers 84 to drive iLEDs 60. As shown in FIG. 19, electrodes 26 connecting pixel circuit 24 to iLEDs 60 can be electrode 26 buses comprising one or more wires and drivers 84 can comprise multiple drivers 84, for example one for each wire in the electrode 26 bus connected to each iLED 60. In some embodiments, pixel clusters 80 can be optionally disposed on pixel cluster substrate 23 and can be a module that can be tested before disposition (e.g., by micro-transfer printing or pick-and-place) on display substrate 10.

Figure 20:
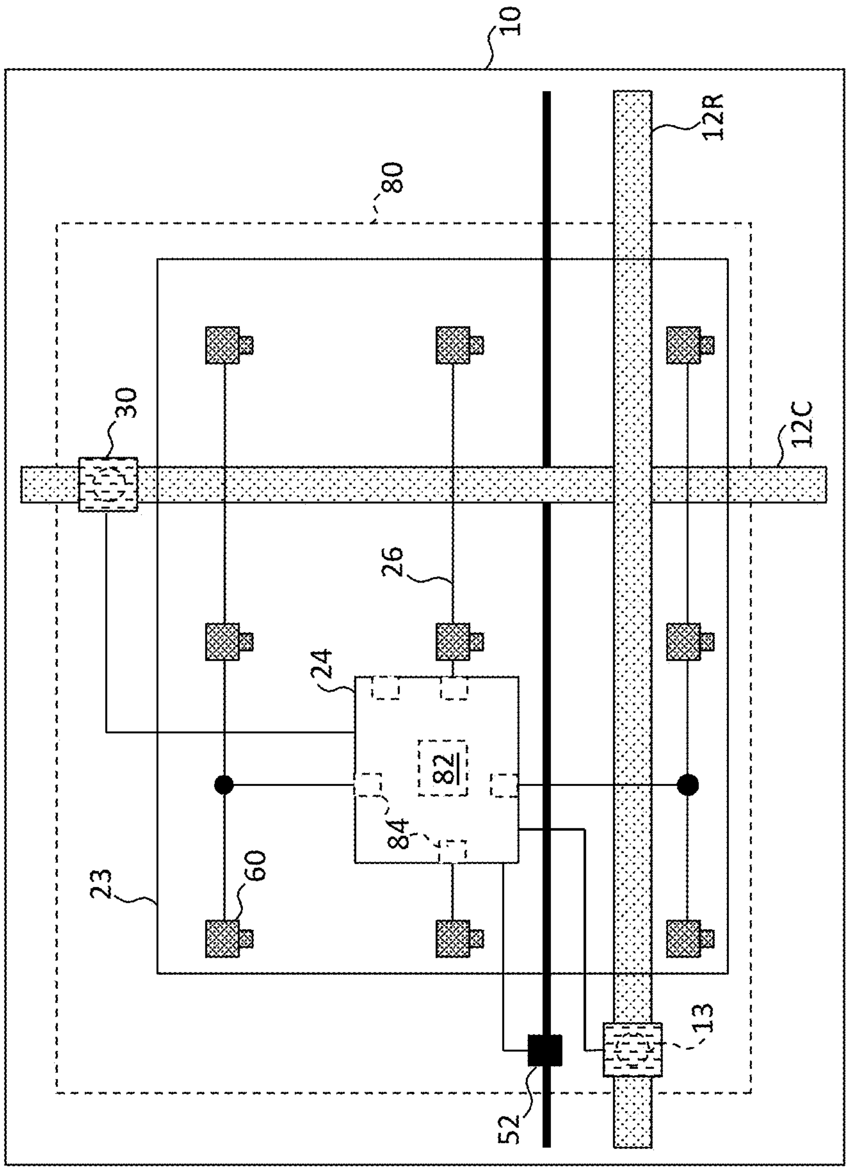
FIG. 20 is a schematic diagram of a pixel cluster with light sensors external to the pixel substrate according to illustrative embodiments of the present disclosure.

FIGS. 2, 6, 8, and 11 illustrate embodiments in which light sensors 30 and contact pad 52 (e.g., an electrical connection) for row wire 14 are disposed on pixel substrate 22. In some embodiments, any one of light sensors 30 (and optical structures 13, and contact pad 52 can be disposed on display substrate 10 and the remainder of pixel cluster 80 (e.g., pixel circuit 24, pixel drivers 84, pixel memory 82, electrodes 26, and iLEDs 60) can be disposed on pixel cluster substrate 23 and connected to light sensors 30 and contact pads 52 with wires, as shown in FIG. 20. FIGS. 4 and 5 illustrate wires (e.g., electrodes 26) extending from display substrate 10 onto pixel cluster substrate 23 to connect light sensors 30 and contact pads 52 to pixel circuit 24. In some embodiments, pixel cluster 80 comprises only those components disposed on pixel cluster substrate 23. Disposing light sensors 30 on display substrate 10 simplifies optical signal propagation to light sensors 30, since in such embodiments pixel cluster substrate 23 is not disposed between light-pipes 12 and light sensors 30.

In embodiments of the present disclosure, multiple light sensors 30 are optically coupled to each row light-pipe 12R and multiple light sensors 30 are optically coupled to each column light-pipe 12C so that every pixel 20 or pixel cluster 80 can be optically connected to row and column light-pipes 12R, 12C to receive optical signals from row and column controllers 16, 18. Light sensors 30 can be disposed on display substrate 10 or on pixel substrate 22 (if present) or pixel cluster substrate 23 (if present). In some embodiments, light-sensors 30 are disposed on display substrate 10 and connected to pixel circuit 24 on pixel substrate 22 (if present) or pixel cluster substrate 23 (if present). If pixel substrate 22 or pixel cluster substrate 23 is present and light-sensor 30 is disposed on pixel substrate 22 or pixel cluster substrate 23, at least some light 38 from light-pipe 12 can be lost in pixel substrate 22 or pixel cluster substrate 23. Thus, by disposing light sensor 30 on display substrate 10 and electrically connecting light sensors 30 to pixel circuit 24 on pixel substrate 22 or pixel cluster substrate 23, light 38 is more effectively coupled into light sensors 30 with fewer optical losses.

Figure 21:
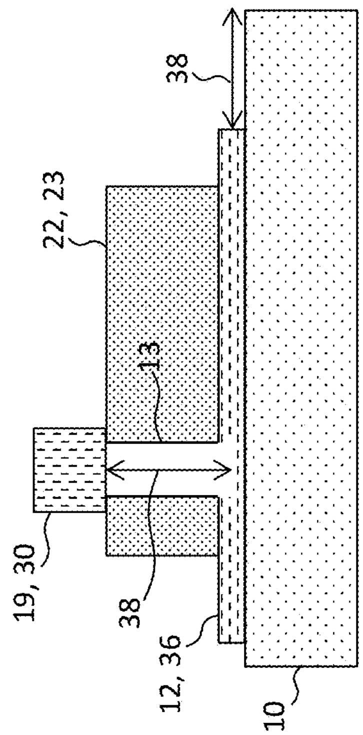
FIG. 21 is a schematic cross section of an optical via according to illustrative embodiments of the present disclosure.

In some embodiments, and as shown in FIG. 21, optical structure 13 can be or comprise an optical via optically connecting light sensor 30 through pixel substrate 22 or pixel cluster substrate 23 to light-pipe 12, improving the optical coupling between light sensor 30 and light-pipe 12 and reducing losses. An optical via can transmit light from one end of the optical via to another without substantially or effectively losing any light 38. An optical via can be a relatively short light-pipe 12 that conducts light through a substrate, such as pixel substrate 22 or pixel cluster substrate 23. Since multiple light sensors 30 can be optically connected to a single light-pipe 12, it can be important to efficiently use light 38 in light-pipe 12 and reduce optical losses so that every light sensor 30 optically coupled to light-pipe 12 has sufficient light 38 to detect optical signals in light-pipe 12.

Optical vias (optical structures 13) can be useful even if pixel substrate 22 or pixel cluster substrate 23 is substantially transparent (e.g., 50% or more transparent) to light 38 because the optical via can more effectively transmit light 38 from light-pipe 12 to light sensor 30 with fewer losses than if the optical via was not present. Optical via (optical structure 13) can also be useful if pixel substrate 22 or pixel cluster substrate 23 is substantially opaque (e.g., less than 50% transparent, e.g., comprising silicon) to light 38 because otherwise, in some embodiments, light 38 cannot be effectively transmitted from light-pipe 12 to light sensor 30. The optical via (an optical structure 13) can be coated with a reflective material, e.g., aluminum or silver. The optical via can be hollow and filled with air or another gas) or solid, for example filled with a transparent material such as glass, silicon nitride, silicon dioxide, or plastic. The optical via can comprise a same material as light-pipe 12. Optical vias can be readily formed through pixel substrate 22 or pixel cluster substrate 23 because they can be made very thin, as is commonly the case for micro-transfer-printed structures for example having a thickness from one to ten microns, and through vias can be readily etched through such thin substrates. Reflective layers can be deposited by evaporating a suitably reflective metal and patterned using photolithographic methods and materials.

In embodiments of the present disclosure, system (e.g., display or imaging) substrate 10 can comprise multiple layers, for example layers of dielectric material in or between each of which is a patterned layer of metal, for example metal conductors, in a wire layer. In some embodiments, light-pipes 12 can be disposed in a dielectric material layer in which or between which a patterned metal layer or dielectric light-pipe-layer is disposed. In some embodiments, light-pipes 12 can be disposed in a dielectric material layer different from a layer in which a patterned metal layer is disposed, for example in a light-pipe 12 layer. In some embodiments, light-pipes 12 can be disposed in, on, or over a top layer of system substrate 10. Light-pipes 12 can be disposed in layers (e.g., layers of row or column light-pipes 12R, 12C) or can be disposed in a common light-pipe 12 layer with crossovers where one light-pipe 12 can pass under or over another light-pipe 12, for example with optical vias, for example comprising angled reflectors.

According to embodiments of the present disclosure, pixel circuits 24, light sensors 30, or iLEDs 60 can be formed or disposed in or on source wafers constructed using, for example, one or more of integrated circuit, micro-electro-mechanical, and photolithographic methods. Pixel 20 can be assembled on a pixel source wafer, for example a glass, polymer, or semiconductor (e.g., silicon) source wafer. Pixel circuits 24, light sensors 30, iLEDs 60, or pixels 20 (referred to collectively and individually as components) can comprise one or more different component materials, for example, non-crystalline or crystalline semiconductor materials such as silicon or compound semiconductor materials. Any of the source wafers can comprise a sacrificial layer comprising laterally separated sacrificial portions over which any of the components are completely disposed and can be connected by tethers (e.g., iLED tethers 61, pixel circuit tethers 25, light-sensor tethers 31, or pixel tethers 21) to anchor portions separating the sacrificial portions. The components can be micro-transfer printed from their respective source wafers to a target substrate (e.g., pixel substrate 22 or system substrate 10) using a stamp (e.g., an elastomeric stamp).

Any of the components can be micro-devices having at least one of a length and a width no more than 200 microns (e.g., no more than 100 microns, no more than 50 microns, no more than 25 microns, no more than 15 microns, no more than 10 microns, or no more than five microns), and, optionally, a thickness of no more than 50 microns (e.g., no more than 25 microns, no more than 15 microns, no more than 10 microns, no more than five microns, no more than two microns, or no more than one micron). In some embodiments, any of the components can be unpackaged dice (each an unpackaged die) transferred directly from native source wafers on or in which they are constructed to corresponding target substrates (e.g., pixel substrate 22 or system substrate 10) without wafer dicing.

System (e.g., display or imaging) substrate 10 or pixel substrates 22 can be any destination substrate or target substrate to which one or more components are transferred (e.g., micro-transfer printed), for example flat-panel display or imaging substrates 10, printed circuit boards, or similar substrates. In certain embodiments, system substrate 10 or pixel substrate 22 can have multiple layers and can be or comprise a member selected from the group consisting of polymer, plastic, resin, polyimide, PEN, PET, metal, metal foil, glass, a semiconductor (e.g., silicon), a compound semiconductor, quartz, ceramics, and sapphire. In certain embodiments, system substrate 10 or pixel substrate 22 has a thickness from 5 microns to 20 mm (e.g., 5 to 10 microns, 10 to 50 microns, 50 to 100 microns, 100 to 200 microns, 200 to 500 microns, 500 microns to 0.5 mm, 0.5 to 1 mm, 1 mm to 5 mm, 5 mm to 10 mm, or 10 mm to 20 mm). In certain embodiments, system substrate 10 has a length, width, or diagonal from 10 cm, 20 cm, 40 cm, 50 cm, 70 cm, 1 meter, 2 meters, 4 meters, 5 meters, or 10 meters.

In some embodiments of the present disclosure, a layer of adhesive, such as a layer of resin, polymer, or epoxy, either curable or non-curable, adheres any one or more of the components onto a corresponding target substrate (e.g., pixel substrate 22 or system substrate 10) and can be disposed, for example by coating or lamination. In some embodiments, the layer of adhesive is disposed in a pattern, for example using inkjet, screening, or photolithographic techniques. In some embodiments, a layer of adhesive is coated, for example with a spray or slot coater, and then patterned, for example using photolithographic techniques.

Patterned electrical conductors (e.g., wires, traces, or electrical contact pads 52 such as those found on printed circuit boards, flat-panel display substrates, and in thin-film circuits) can be formed on any one or combination of one or more pixel substrate 22 and system substrate 10. One or more electrical contact pads 52 can be in or on system substrate 10 and/or in or on one or more of the components to electrically connect them. Such patterned electrical conductors (e.g., electrodes 26) and contact pads 52 can comprise, for example metal, transparent conductive oxides, or cured conductive inks and can be constructed using photolithographic methods and materials, for example metals such as aluminum, gold, or silver deposited by evaporation and patterned using pattern-wise exposed, cured, and etched photoresists, or constructed using imprinting methods and materials or inkjet printers and materials, for example comprising cured conductive inks deposited on a surface or provided in micro-channels in or on system substrate 10.

Micro-transfer printing processes suitable for disposing any one or more of the components onto pixel substrates 22 or system substrates 10 are described in *Inorganic light-emitting diode displays using micro-transfer printing* (Journal of the Society for Information Display, 2017, DOI #10.1002/jsid.610, 1071-0922/17/2510-0610, pages 589-609), U.S. Pat. No. 8,722,458 entitled Optical Systems Fabricated by Printing-Based Assembly, U.S. patent application Ser. No. 15/461,703 entitled Pressure-Activated Electrical Interconnection by Micro-Transfer Printing, U.S. Pat. No. 8,889,485 entitled Methods for Surface Attachment of Flipped Active Components, U.S. patent application Ser. No. 14/822,864 entitled Chiplets with Connection Posts, U.S. patent application Ser. No. 14/743,788 entitled Micro-Assembled LED Displays and Lighting Elements, and U.S. patent application Ser. No. 15/373,865, entitled Micro-Transfer Printable LED Component, the disclosure of each of which is incorporated herein by reference in its entirety.

For a discussion of micro-transfer printing techniques, see also U.S. Pat. Nos. 7,622,367 and 8,506,867, each of which is hereby incorporated by reference in its entirety. Micro-transfer printing using compound micro-assembly structures and methods can also be used with the present disclosure, for example, as described in U.S. patent application Ser. No. 14/822,868, filed Aug. 10, 2015, entitled Compound Micro-Assembly Strategies and Devices, which is hereby also incorporated by reference in its entirety. Accordingly, in some embodiments, printed electro-optically controlled system 99 or optically controlled system 98 is a compound micro-assembled structure (e.g., a macro-system).

According to various embodiments of the present disclosure, source wafers can be provided with components, patterned sacrificial portions, tethers (e.g., iLED tethers 61, pixel circuit tethers 25, light-sensor tethers 31, or pixel tethers 21), and anchors already formed, or they can be constructed as part of a method. Components, stamps, pixel substrates 22, and system substrate 10 can be made separately and at different times or in different temporal orders or locations and provided in various process states.

Any one or more of the components, in certain embodiments, can be constructed using foundry fabrication processes used in the art. Layers of materials can be used, including materials such as metals, oxides, nitrides and other materials used in the integrated-circuit art. Components can have a different sizes, for example, each having an area of 100 square microns or larger, 1000 square microns or larger or 10,000 square microns or larger, 100,000 square microns or larger, or 1 square mm or larger, can have variable aspect ratios, for example between 1:1 and 10:1 (e.g., 1:1, 2:1, 5:1, or 10:1), and can be rectangular or can have other shapes.

Various embodiments of structures and methods are described herein. Structures and methods were variously described as transferring components, printing components, or micro-transfer printing components as examples and the particular word used should be understood to be non-limiting as to the methods that may be used to implement the described embodiments. In some embodiments, micro-transfer-printing includes using a stamp (e.g., an elastomeric stamp such as a PDMS stamp) to transfer a component using controlled adhesion. For example, an exemplary stamp can use kinetic or shear-assisted control of adhesion between the stamp and a component. It is contemplated that, in certain embodiments, where a method is described as including printing (e.g., micro-transfer-printing) a component, other analogous embodiments exist using a different transfer method. As used herein, transferring a component (e.g., from a component source wafer or wafer to a target substrate) can be accomplished using any one or more of a variety of known techniques. For example, in certain embodiments, a pick-and-place method can be used. As another example, in certain embodiments, a flip-chip method can be used (e.g., involving an intermediate, handle or carrier substrate). In methods according to certain embodiments, a stamp is a vacuum tool or other transfer device used to transfer components. In some embodiments, a stamp uses one or more of electrostatic forces, magnetic forces, and vacuum forces to transfer components (e.g., applied to individual components by individual stamp posts).

As is understood by those skilled in the art, the terms "over" and "under" are relative terms and can be interchanged in reference to different orientations of the layers, elements, and substrates included in the present disclosure. Furthermore, a first layer "on" a second layer is a relative orientation of the first layer to the second layer that does not preclude additional layers being disposed therebetween. For example, a first layer on a second layer, in some implementations, means a first layer directly on and in contact with a second layer. In other implementations, a first layer on a second layer includes a first layer and a second layer with another layer therebetween (e.g., an in mutual contact). As is also understood by those skilled in the art, the terms "row" and "column" are arbitrary and relative designations that can be exchanged.

Having described certain implementations of embodiments, it will now become apparent to one of skill in the art that other implementations incorporating the concepts of the disclosure may be used. Therefore, the disclosure should not be limited to certain implementations, but rather should be limited only by the spirit and scope of the following claims.

Throughout the description, where apparatus and systems are described as having, including, or comprising specific elements, or where processes and methods are described as having, including, or comprising specific steps, it is contemplated that, additionally, there are apparatus and systems of the disclosed technology that consist essentially of, or consist of, the recited elements, and that there are processes and methods according to the disclosed technology that consist essentially of, or consist of, the recited processing steps.

It should be understood that the order of steps or order for performing certain action is immaterial so long as operability is maintained. Moreover, two or more steps or actions in some circumstances can be conducted simultaneously. The disclosure has been described in detail with particular reference to certain embodiments thereof, but it will be understood that variations and modifications can be effected within the spirit and scope of the disclosure.

PARTS LIST

R row direction
C column direction
10 system substrate/display substrate/imaging (digital camera) substrate
12 light-pipe
12C column light-pipe
12R row light-pipe
13 optical structure
14 row wire
16 row controller
18 column controller
19 light emitter
19C column light emitter
19R row light emitter
20 pixel
21 pixel tether
22 pixel substrate
23 pixel cluster substrate
24 pixel circuit
25 pixel circuit tether
26 electrode
30 light sensor
31 light-sensor tether
34 optical input circuit
36 reflector

38 light
44 electrical input circuit
50 dielectric structure
52 contact pad
60 inorganic light-emitting diodes (iLEDs)
61 iLED tether
70 bus (busbar)
80 pixel cluster
82 pixel memory
84 pixel driver
98 optically controlled system/optically controlled display
99 electro-optically controlled system/electro-optically controlled display
100 provide pixel source wafer step
110 provide pixel circuit source wafer step
120 micro-transfer print pixel circuit to pixel substrate step
130 provide sensor source wafer step
140 micro-transfer print sensor to pixel substrate step
150 provide iLED source wafer step
160 micro-transfer iLED to pixel substrate step
170 dispose pixel wires on pixel substrate step
180 provide system substrate step
190 micro-transfer print pixel to system substrate step

What is claimed:

1. An electro-optically controlled display, comprising:
- a display substrate;
- a plurality of row wires extending in a row direction, wherein each of the plurality of row wires is disposed on or in the display substrate;
- a plurality of row light-pipes extending at least partially in the row direction, wherein each of the plurality of row light-pipes is disposed on or in the display substrate;
- a row controller operable to provide a respective row electrical signal to each of the plurality of row wires and operable to provide a respective row optical signal to each of the plurality of row light-pipes;
- a plurality of column light-pipes extending at least partially in a column direction, wherein each of the plurality of column light-pipes is disposed on or in the display substrate;
- a column controller operable to provide a respective column optical signal to each of the plurality of column light-pipes; and
- a plurality of pixels disposed over the display substrate in a plurality of rows and a plurality of columns, wherein each of the plurality of pixels comprises a pixel circuit that is connected to a combination of (i) a corresponding one of the plurality of row wires, (ii) a corresponding one of the plurality of row light-pipes, and (iii) a corresponding one of the plurality of column light-pipes, wherein the pixel circuit is operable to receive the respective row electrical signal from the corresponding one of the plurality of row wires, to receive the respective row optical signal from the corresponding one of the plurality of row light-pipes, and to receive the respective column optical signal from the corresponding one of the plurality of column light-pipes, wherein the respective column optical signal provides a separate data signal specifying a specified luminance for each of the plurality of pixels connected to the corresponding one of the plurality of column light-pipes.

2. The electro-optically controlled display of claim 1, wherein the respective row electrical signal comprises a row-select signal.

3. The electro-optically controlled display of claim 1, wherein the respective row optical signal comprises a timing signal that is triggered with the respective column optical signal.

4. The electro-optically controlled display of claim 1, wherein the plurality of pixels are arranged in a matrix-addressed array over the display substrate.

5. The electro-optically controlled display of claim 1, wherein:
- (i) the plurality of row wires extend substantially orthogonally relative to the plurality of column light-pipes over the display substrate,
- (ii) the plurality of row light-pipes extend substantially orthogonally relative to the plurality of column light-pipes over the display substrate, or
- (iii) both (i) and (ii).

6. The electro-optically controlled display of claim 1, wherein:
- (i) the column controller comprises at least one inorganic light-emitting diode that emits light into each of the plurality of column light-pipes,
- (ii) the row controller comprises at least one inorganic light-emitting diode that emits light into each of the plurality of row light-pipes, or
- (iii) both (i) and (ii).

7. The electro-optically controlled display of claim 1, wherein the pixel circuit comprises (i) an optical input circuit responsive to the respective column optical signal from the corresponding one of the plurality of column-light pipes and to the respective row optical signal from the corresponding one of the plurality of row light-pipes, and (ii) an electrical input circuit responsive to the respective row electrical signal from the corresponding one of the plurality of row wires, and wherein the optical input circuit comprises one or more light sensors.

8. The electro-optically controlled display of claim 1, wherein each of the plurality of pixels comprises:
- (i) one or more inorganic light-emitting diodes controllable by the pixel circuit,
- (ii) one or more light sensors to which the pixel circuit is responsive, or
- (iii) both (i) and (ii).

9. The electro-optically controlled display of claim 1, wherein each of the plurality of pixels comprises a corresponding pixel substrate non-native to the display substrate, and wherein each of the plurality of pixels is disposed on or in the corresponding pixel substrate.

10. The electro-optically controlled display of claim 9, wherein the corresponding pixel substrate of each of the plurality of pixels comprises a broken or separated pixel tether.

11. The electro-optically controlled display of claim 1, wherein at least two of the plurality of rows of the plurality of pixels are responsive to a common one of the plurality of row light-pipes.

12. The electro-optically controlled display of claim 1, wherein each of the plurality of pixels comprises a light-emitting diode, and wherein the pixel circuit of each of the plurality of pixels controls a luminance of the light-emitting diode responsive to the separate data signal.

13. A pixel, comprising:
- a pixel substrate; and
- a pixel circuit operable to respond to a row electrical signal, a row optical signal, and a column optical signal, the pixel circuit disposed on or in the pixel substrate, and wherein all of (a) the row electrical signal, (b) the row optical signal, and (c) the column optical signal are provided on or in the pixel substrate.

14. The pixel of claim 13, wherein the pixel circuit comprises a light sensor and the pixel comprises an inorganic light-emitting diode that is electrically connected to the pixel circuit and is disposed on, in, or over the pixel substrate.

15. The pixel of claim 13, wherein the pixel substrate comprises a broken or separated pixel tether.

16. The pixel of claim 13, wherein the pixel is a heterogeneous integrated module comprising a semiconductor device and a compound semiconductor device, wherein the semiconductor device comprises a semiconductor and the compound semiconductor device comprises a compound semiconductor different from the semiconductor.

17. The pixel of claim 13, wherein (i) the pixel substrate comprises a semiconductor and the pixel circuit is native to the pixel substrate.

18. The pixel of claim 13, wherein the pixel substrate is a non-semiconductor substrate and the pixel circuit is formed in an integrated circuit comprising a circuit substrate non-native to and disposed on the pixel substrate.

19. An electro-optically controlled imaging system, comprising:

a system substrate;

a plurality of row wires extending in a row direction, wherein each of the plurality of row wires is disposed on or in the system substrate;

a row controller operable to provide a respective row electrical signal to each of the plurality of row wires;

a plurality of column light-pipes extending in a column direction disposed on the system substrate;

a column controller operable to receive a respective column optical signal from each of the plurality of column light-pipes; and a plurality of pixels disposed over the system substrate in a plurality of rows and a plurality of columns, wherein each of the plurality of pixels comprises a pixel circuit that is uniquely electrically connected to a corresponding one of the plurality of row wires and that is optically connected to a corresponding one of the plurality of column light-pipes, wherein the pixel circuit is operable to receive the respective row electrical signal from the corresponding one of the plurality of row wires and to transmit the respective column optical signal from the corresponding one of the plurality of column light-pipes, and wherein the respective column optical signal provides one or more data signals specifying a sensed radiation for each of the plurality of pixels connected to the corresponding one of the plurality of column light-pipes.

20. The electro-optically controlled system of claim 19, further comprising one or more row light-pipes extending at least partially in the row direction, wherein the one or more row light-pipes are disposed on the system substrate, wherein the row controller is operable to provide the respective row optical signal to each of the one or more row light-pipes, and wherein the pixel circuit is connected to a corresponding one of the one or more row light-pipes to receive the respective row optical signal from the corresponding one of the one or more row light-pipes.

* * * * *